(12) United States Patent
Saitoh et al.

(10) Patent No.: US 10,884,176 B2
(45) Date of Patent: Jan. 5, 2021

(54) DISPLAY DEVICE

(71) Applicant: FUJIFILM Corporation, Tokyo (JP)

(72) Inventors: Yukito Saitoh, Minami-ashigara (JP); Yujiro Yanai, Minami-ashigara (JP); Junichi Hirakata, Minami-ashigara (JP); Ryota Matsubara, Tokyo (JP); Kotaro Yasuda, Minami-ashigara (JP); Jun Watanabe, Minami-ashigara (JP)

(73) Assignee: FUJIFILM Corporation, Tokyo (JP)

( * ) Notice: Subject to any disclaimer, the term of this patent is extended or adjusted under 35 U.S.C. 154(b) by 266 days.

(21) Appl. No.: 16/100,562

(22) Filed: Aug. 10, 2018

(65) Prior Publication Data

US 2019/0004236 A1 Jan. 3, 2019

Related U.S. Application Data

(63) Continuation of application No. PCT/JP2017/004243, filed on Feb. 6, 2017.

(30) Foreign Application Priority Data

Feb. 12, 2016 (JP) .................................. 2016-024970
Apr. 18, 2016 (JP) .................................. 2016-083061

(51) Int. Cl.
*F21V 8/00* (2006.01)
*H01L 51/52* (2006.01)
(Continued)

(52) U.S. Cl.
CPC .............. *G02B 6/0038* (2013.01); *G02B 1/11* (2013.01); *G02B 6/0036* (2013.01); *G09F 9/00* (2013.01);
(Continued)

(58) Field of Classification Search
CPC ...... G02B 6/0038; G02B 1/11; G02B 6/0036; G02B 5/045; G02B 2207/123; G02B 6/0035; G09F 9/00; H01L 51/5262
See application file for complete search history.

(56) References Cited

U.S. PATENT DOCUMENTS 9,581,755 B2 * 2/2017 Huang .................. G02F 1/1336
2004/0257484 A1 * 12/2004 Ishitaka .................... G02B 1/11
349/16
(Continued)

FOREIGN PATENT DOCUMENTS

DE 102014003298 A1 9/2015
GB 2428128 A 1/2007
(Continued)

OTHER PUBLICATIONS

Japanese Office Action, dated Jul. 9, 2019, for corresponding Japanese Application No. 2017-566936, with an English machine translation.
(Continued)

*Primary Examiner* — Bao Q Truong
(74) *Attorney, Agent, or Firm* — Birch, Stewart, Kolasch & Birch, LLP

(57) ABSTRACT

Provided is a display device capable of switching between a wide viewing angle and a narrow viewing angle with a simple configuration and simple control. The problem is solved by providing a display element and an optical switching element which is disposed on a visible side of the display element, in which the optical switching element has a light guiding plate and a light source for causing light to be incident on an end surface of the light guiding plate, and 80% or more of the light emitted from the light guiding plate when the light source is turned on is emitted to a region at an angle of 30° or more with respect to a normal line of the
(Continued)

light guiding plate on a surface on the opposite side of the display element.

12 Claims, 7 Drawing Sheets

(51) Int. Cl.
  *G09F 9/00* (2006.01)
  *G02B 1/11* (2015.01)
  *G02B 5/04* (2006.01)
(52) U.S. Cl.
  CPC .......... *H01L 51/5262* (2013.01); *G02B 5/045* (2013.01); *G02B 2207/123* (2013.01)

(56) References Cited

U.S. PATENT DOCUMENTS

| | | | |
|---|---|---|---|
| 2007/0008456 A1* | 1/2007 | Lesage | G02B 6/0058 349/62 |
| 2007/0146608 A1 | 6/2007 | Jin et al. | |
| 2015/0103393 A1 | 4/2015 | Huang | |
| 2015/0293296 A1* | 10/2015 | Kikuchi | G02B 6/0038 362/606 |

FOREIGN PATENT DOCUMENTS

| | | |
|---|---|---|
| JP | 2003-57652 A | 2/2003 |
| JP | 2004-279866 A | 10/2004 |
| JP | 2006-235288 A | 9/2006 |
| JP | 2007-19030 A | 1/2007 |
| JP | 2007-178979 A | 7/2007 |

OTHER PUBLICATIONS

International Preliminary Report on Patentability and Written Opinion of the International Searching Authority(Forms PCT/IB/326, PCT/IB/373 and PCT/ISA/237), dated Aug. 23, 2018, for International Application No. PCT/JP2017/004243, with an English Translation of the Written Opinion.

International Search Report (Form PCT/ISA/210), dated Apr. 25, 2017, for International Application No. PCT/JP2017/004243, with an English translation.

* cited by examiner

DISPLAY DEVICE

CROSS-REFERENCE TO RELATED APPLICATIONS

This application is a Continuation of PCT International Application No. PCT/JP2017/004243 filed on Feb. 6, 2017, which claims priority under 35 U.S.C. § 119(a) to Japanese Patent Application No. 2016-024970 filed on Feb. 12, 2016 and Japanese Patent Application No. 2016-083061 filed on Apr. 18, 2016. Each of the above applications is hereby expressly incorporated by reference, in its entirety, into the present application.

BACKGROUND OF THE INVENTION

1. Field of the Invention

The present invention relates to a display device such as a liquid crystal display device or an organic electroluminescent display device.

2. Description of the Related Art

In electronic devices for personal use such as a tablet personal computer (PC), a laptop PC, and a mobile phone such as a smartphone, there is a demand for preventing a screen from being peeped by a peripheral third party. Therefore, in these electronic devices, the viewing angle of the screen is narrowed so that the screen is not to be peeped by a peripheral third party.

As a method of narrowing the viewing angle of a screen, a method of bonding a film in which black stripes are formed (louver film) or the like to a screen has been known.

However, in this method, the screen is fixed in a state in which the viewing angle of the screen is narrow. Therefore, for example, in a case where a screen is needed to be visually recognized in an oblique direction, such as a case where several persons visually recognize a screen, the visibility in the oblique direction is deteriorated and the usability of electronic devices is deteriorated.

In order to solve such problems, in electronic devices such as a tablet PC and a laptop PC, various display devices capable of switching between a display at a wide viewing angle and a display at a narrow viewing angle to realize security such as prevention of a peep from the side and if necessary, sufficient visibility from the side have been proposed.

For example, JP2007-178979A discloses a liquid crystal display device including a first substrate having gate wirings and data wirings corresponding to subpixels of red (R), green (G), blue (B), and white (W), a thin film transistor disposed at each crossing points of the gate wirings and the data wirings, a plate type first common electrode disposed in the subpixels of R, G, B, and W, a pixel electrode having a plurality of slits, connected to the thin film transistor and insulated from the first common electrode, a second substrate bonded to face the first substrate and including a liquid crystal layer in a space between the second substrate and the first substrate, and a plate type second common electrode formed on the second substrate so as to correspond to each W subpixel.

In the liquid crystal display device, in a case of a wide viewing angle display, the viewing angle can be widened by driving the W subpixel in a FFS mode like subpixels adjacent to R, G, and B and the W luminance can also be compensated, and in a case of a narrow viewing angle display, the viewing angle can be narrowed by driving the W subpixel in an ECB mode forming a vertical electric field unlike subpixels adjacent to R, G, and B.

JP2004-279866A discloses a display device including a screen having a viewing angle limited in a one-dimensional direction, and image display switching means for switching between a personal view mode in which an erection direction of an image displayed on the screen is approximately orthogonal to the viewing angle limiting direction and a multi-view mode in which the erection direction of the image coincides with the viewing angle limiting direction.

That is, in this display device, depending on whether or not the viewing angle of the screen is limited in the one-dimensional direction by using a microprism sheet or the like, and the top and the bottom of the image are made to coincide with the viewing angle limiting direction by rotating the image by 90°, a wide viewing angle display and a narrow viewing angle display can be switched.

SUMMARY OF THE INVENTION

According to these display devices, display visual recognition in a state in which a peep of a third party from the side can be prevented and appropriate display visual recognition for several persons can be achieved with one display device by switching between a wide viewing angle display and a narrow viewing angle display.

However, in the display device disclosed in JP2007-178979A, a plurality of substrates and the W subpixel not provided in a normal display device are required and thus the device configuration is complicated.

On the other hand, in the display device disclosed in JP2004-279866A, it is required to rotate an image by 90° to switch between a wide viewing angle display and a narrow viewing angle display, and thus extra image processing is required. In a normal display device, the aspect ratio of an image is different. Thus, in this display device, the aspect ratio of the screen is different in a wide viewing angle display and a narrow viewing angle display.

An object of the present invention is to solve problems in the related art and to provide a display device capable of switching between a wide viewing angle display and a narrow viewing angle display with a limited viewing angle with a simple configuration in a display device used for a tablet PC or a laptop PC without performing image processing or the like.

In order to achieve such an object, there is provided a display device of the present invention comprising:

a display element; and an optical switching element which is disposed on a visible side of the display element, in which the optical switching element includes a light guiding plate and a light source for causing light to be incident on an end surface of the light guiding plate, and 80% or more of light emitted from the light guiding plate in a case where the light source is turned on is emitted to a region at an angle of 30° or more with respect to a normal line of the light guiding plate on a principal surface on an opposite side of the display element.

In the display device of the present invention, it is preferable that at least one principal surface of the light guiding plate has an uneven shape.

It is preferable that the uneven shape is formed of grooves that the principal surface of the light guiding plate has.

It is preferable that the groove has a triangular shape.

It is preferable that an angle of an apex angle of the triangular groove is 100° to 150°.

It is preferable that the principal surface of the light guiding plate on which the grooves are formed is covered by a layer having a different refractive index from that of the light guiding plate.

It is preferable that the uneven shape is formed of convex portions that the principal surface of the light guiding plate has.

It is preferable that the convex portion has a spherical segment shape.

It is preferable that the convex portion is formed by using an aligned liquid crystal.

It is preferable that the convex portion is formed by a particle.

It is preferable that the light guiding plate has a light guiding plate main body, a support layer which is laminated on the light guiding plate main body, a binder layer which is laminated on the support layer, and the particle which is held in the binder layer and protrudes from the binder layer.

It is preferable that the light guiding plate has a light guiding plate main body, a binder layer which is laminated on the light guiding plate main body, and the particle which is held in the binder layer and protrudes from the binder layer.

It is preferable that the principal surface of the light guiding plate having the uneven shape is covered by a layer having a different refractive index from that of the convex portion.

It is preferable that the display device further comprises an air layer between the display element and the light guiding plate.

It is preferable that the display device further comprises a bonding layer which is provided between the display element and the light guiding plate for bonding the display element and the light guiding plate and has a difference in refractive index from the light guiding plate of 0.05 or more.

It is preferable that the display device further comprises an antireflection layer on the principal surface of the light guiding plate on a display device side.

It is preferable that the display device further comprises an antireflection layer on an image display surface of the display element.

According to the display device of the present invention, it is possible to switch between a wide viewing angle display and a narrow viewing angle display in which a viewing angle is limited with a simple configuration and simple control.

DESCRIPTION OF THE PREFERRED EMBODIMENTS

Hereinafter, a display device of the present invention will be described in detail based on preferable examples shown in the accompanying drawings.

In this specification, numerical ranges represented by "to" include numerical values before and after "to" as lower limit values and upper limit values.

In this specification, the meaning of "entire", "all" or "entire surface" includes not only 100% but also a case where an error range is generally allowable in the technical field, for example, 99% or more, 95% or more, or 90% or more.

In this specification, "(meth)acrylate" represents "either or both of acrylate and methacrylate".

In the present specification, $Re(\lambda)$ represents an in-plane retardation at a wavelength of $\lambda$. $Re(\lambda)$ is measured using KOBRA 21ADH or WR (manufactured by Oji Scientific Instruments Co., Ltd.) by causing light at a wavelength of $\lambda$ nm to be incident in a film normal direction. The measurement wavelength $\lambda$ nm can be selected by manually changing a wavelength selective filter or changing a measured value using a program or the like to perform the measurement. The details of the method of measuring $Re(\lambda)$ are described in paragraphs [0010] to [0012] of JP2013-041213A and the contents thereof are incorporated herein by reference. In this specification, unless otherwise specified regarding the measurement wavelength, the measurement wavelength is 550 nm.

In the present specification, "haze" refers to a value measured using a haze meter NDH-2000 (manufactured by Nippon Denshoku Industries Co., Ltd.). Theoretically, haze refers to a value expressed by the following expression. (Diffuse Transmittance of Natural Light at 380 to 780 nm)/(Diffuse Transmittance of Natural Light at 380 to 780 nm+Direct Transmittance of Natural Light)×100%

The diffuse transmittance refers to a value calculated by subtracting the direct transmittance from a total transmittance which is obtained using a spectrophotometer and an integrating sphere unit. The direct transmittance refers to a transmittance at 0° in a case where a value measured using an integrating sphere unit is used. That is, low haze means that the quantity of directly transmitted light is large in the total quantity of transmitted light. The refractive index is a refractive index with respect to light having a wavelength of 589.3 nm.

Figure 1:
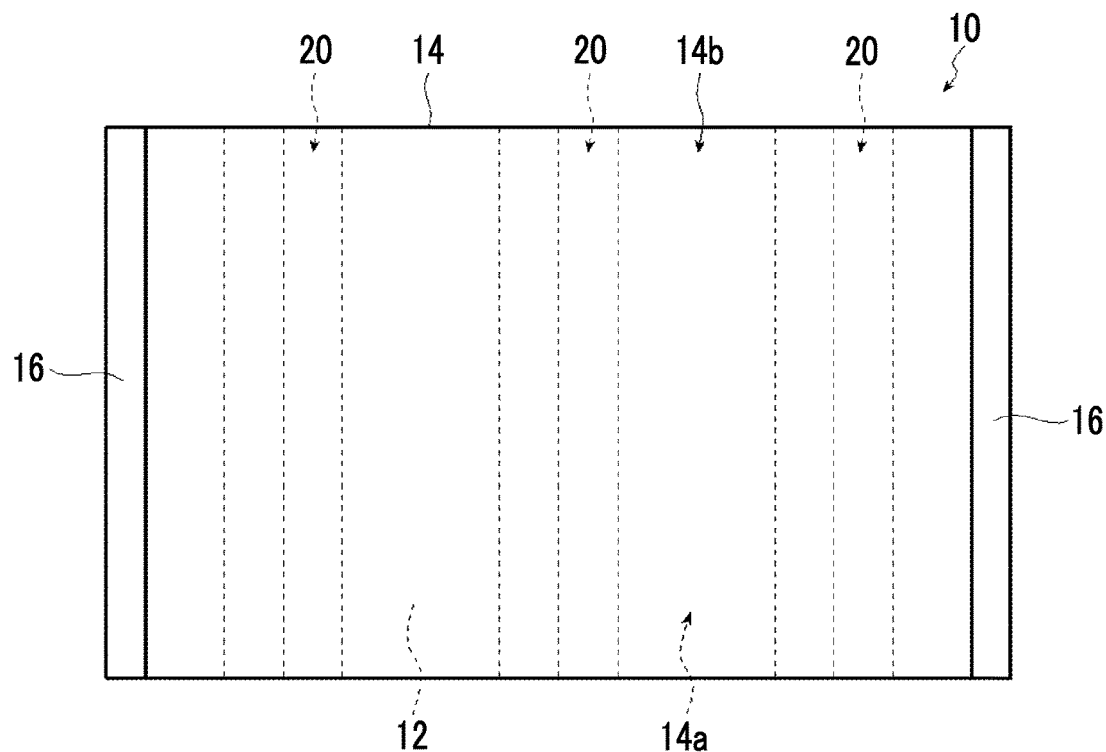
FIG. 1 is a schematic front view showing an example of a display device of the present invention.
Figure 2:
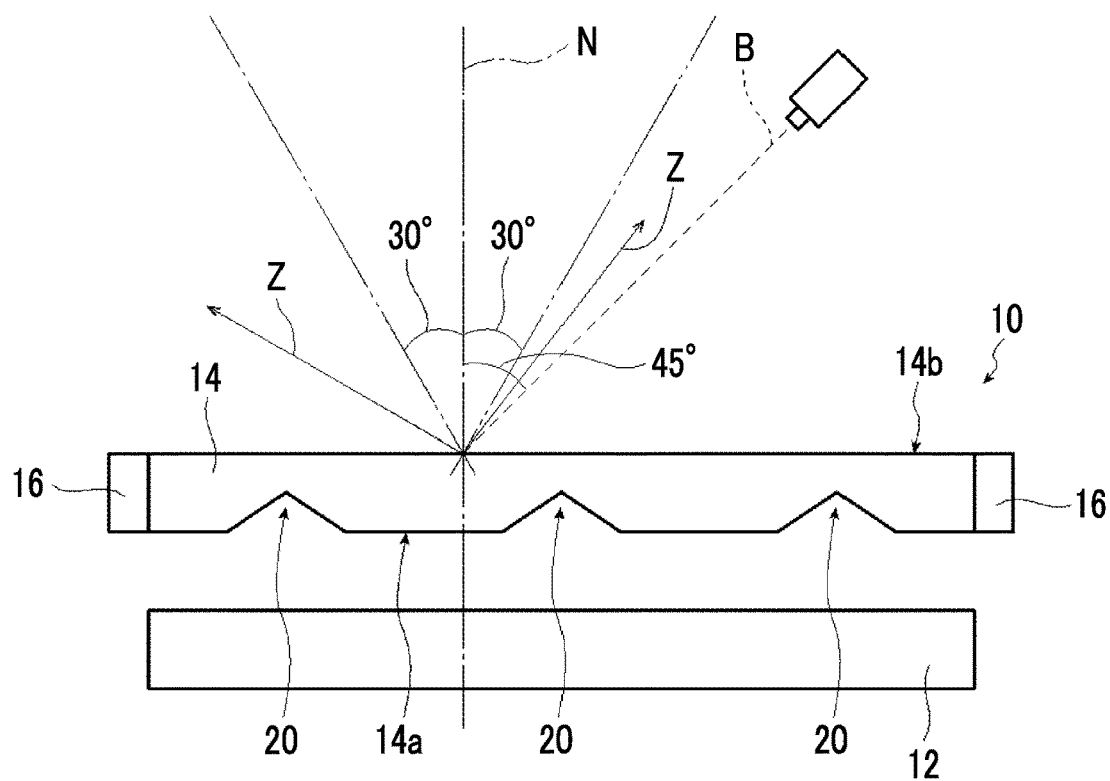
FIG. 2 is a schematic side view showing the display device shown in FIG. 1.

FIG. 1 conceptually shows a front view of an example of a display device of the present invention. FIG. 2 conceptually shows a side view of the display device shown in FIG. 1. The front view is a view showing the display device of the present invention as seen from a visible side (viewing side).

As shown in FIGS. 1 and 2, a display device 10 has a display element 12, and an optical switching element including a light guiding plate 14, and a light source 16. The light guiding plate 14 is disposed such that one principal surface (outermost surface) thereof faces an image display surface of the display element 12. In the display device 10, an air layer is provided between the display element 12 and the light guiding plate 14.

In the present invention, the display device 10 may have various members that known display devices have, such as a housing constituting the profile of the display device 10, support means for supporting driving means and control means of the display element 12, the display element 12, and the like, and operation means of the display device 10, in addition to members shown in the drawings.

As conceptually shown in FIG. 2, in the optical switching element of the display device 10 of the present invention, in a case where the light source 16 is turned on, as shown by an arrow Z, 80% or more of light emitted (radiated) from the light guiding plate 14 is emitted to a region at a wide angle of 30° or more with respect to a normal line N (a dashed line in FIG. 2) to the principal surface of the light guiding plate 14 on the principal surface of the light guiding plate 14 on the opposite side of the display element 12. The normal line N of the principal surface of the light guiding plate 14 is a line orthogonal to the principal surface of the light guiding plate 14. The principal surface of the light guiding plate 14 on the opposite side of the display element 12 is a surface of the light guiding plate 14 on the visible side of the display device 10.

That is, as shown in FIG. 2, in the optical switching element of the display device 10 of the present invention, in a case where the light source 16 is turned on, as shown by the arrow Z, 80% or more of light emitted from the light guiding plate 14 is emitted to a region on the outer side of a two-dot chain line indicating 30° with respect to the normal line N from the surface on the visible side. In other words, in the optical switching element of the display device 10 of the present invention, in a case where the light source 16 is turned on, as shown by the arrow Z, 80% or more of light emitted from the light guiding plate 14 is emitted from the surface of the visible side at an angle of 30° or more with respect to the normal line N.

A light quantity distribution (light distribution) of light emitted from the light guiding plate 14 may be measured by using various commercially available light distribution measurement devices. The light quantity distribution also can be measured by performing conversion between luminance and luminous flux using a luminance measuring device. The details of the measurement method are described in "Illuminating Engineering" of The Institute of Electrical Engineers of Japan (1978) in detail.

As described above, the light guiding plate 14 is disposed such that one principal surface thereof faces the image display surface of the display element 12. In the display device 10 of the present invention, a user visually recognizes an image that the display element 12 displays through the light guiding plate 14.

Herein, although described later in detail, in the display device 10 of the present invention, normally, the light source 16 is turned off and a wide viewing angle display is performed as in a general display device. In contrast, in a case where a narrow viewing angle display is performed, the light source 16 is turned on, the viewing angle is limited by emitting light in an oblique direction from the light guiding plate 14, and the visibility of the image from the oblique direction is lowered.

Since the display device 10 of the present invention adopts such a configuration, normally, a display suitable from a lateral direction can be visually recognized by switching between a display at a normal wide viewing angle and a display at a narrow viewing angle with a limited viewing angle, and if necessary, for example, a peripheral third party is prevented from visually recognizing the display by making a viewing angle narrow by turning on the light source 16.

In the display device 10, as the display element 12, various display elements (display panels) used in known display devices used for a tablet personal computer (PC), a laptop PC, a mobile phone such as a smartphone, or the like can be used.

Specific examples thereof include a liquid crystal display element, an organic electro luminescence (EL) display element, a plasma display element, and an electronic paper element.

The light source 16 causes light to be emitted from the principal surface of the light guiding plate 14 on the visible side to be incident on an incident surface set at the end surface of the light guiding plate 14.

In the display device 10 of the present invention, as the light source 16, various known light sources, such as a light source, a fluorescent lamp, and laser, used in so-called edge-light type backlight units in which light sources such as light emitting diodes (LEDs) are arranged along the end surface of the light guiding plate 14 which becomes the incident surface can be used. The light source used in the display device 10 of the present invention may emit light to the end surface of the light guiding plate 14 from a light source present in a backlight unit through a light guiding member as long as the light source causes light to be incident on the end surface of the light guiding plate.

Among these, since a light source such as an LED or laser strongly emits only light having a desired wavelength, the light source is easily controlled and suitably used.

The wavelength and color of the light emitted from the light guiding plate 14 are not limited. The color of light may be white or a specific color may be selected. Accordingly, the light source 16 using an LED, laser, or the like may be selected according to the color of light to be emitted or the like.

Since the display device 10 shown in the drawing has the light sources 16 corresponding to 2 facing end surfaces of the light guiding plate 14 having a rectangular principal surface shape. However, the present invention is not limited thereto.

That is, in the display device of the present invention, the optical switching element may have light sources 16 corresponding to all of four end surfaces of the light guiding plate 14 having a rectangular principal surface, may have light sources 16 corresponding to three end surfaces of the light guiding plate 14, or may have a light source 16 corresponding to only one end surface of the light guiding plate 14.

In the display device 10, the light source 16 corresponding to one end surface of the light guiding plate 14 may be constituted of a plurality of light sources. In a case where the light source 16 corresponding to one end surface of the light guiding plate 14 is constituted of a plurality of light sources, turning-on of each light source may be controllable or may be individually uncontrollable.

Although not shown in the drawing, the display device 10 has a driver or control means for driving the light source 16.

Each light source 16 independently has a switching mechanism and control means for controlling driving of the light source 16 can independently control the individual light sources 16. Accordingly, in the display device 10, both two light sources 16 may be turned on or only one of the two light sources 16 may be turned on according to an input instruction or the like from a user. Further, even in a case where the light source 16 corresponding to one end surface of the light guiding plate 14 is constituted of a plurality of light sources, the control means may control turning-on of each individual light source according to input instruction or the like from a user. That is, a control device of the light source 16 may control the lighting time and lighting position of the light source 16.

The control means may have a function of adjusting the light quantity of the light source 16. Thus, for example, in a case where the viewing angle is narrowed according to an input instruction or the like from a user, the visibility from the lateral direction can be adjusted and further, light with a suitable light quantity according to environmental illuminance or the like can be emitted.

The light source 16 may emit light in a pattern such as flashing.

Regarding the above point, even in a case where one light source 16 is used or in a case where three light sources 16 are used, the same is applied thereto.

The light guiding plate 14 propagates the light incident from the end surface to an in-plane direction and emits light from the principal surface. As described above, the light guiding plate 14 is disposed such that one principal surface faces the image display surface of the display element 12. In the present invention, the optical switching element of the present invention is constituted of the light guiding plate 14 and the light source 16 for causing light to be incident on the end surface of the light guiding plate 14.

In the following description, a principal surface of the light guiding plate 14 facing the display element 12 is also referred to as a "rear surface 14a" and the opposite side surface of the light guiding plate 14, that is, a surface of the light guiding plate 14 on the visible side in the display device 10 is also referred to as a "visible surface 14b".

As the light guiding plate 14, as long as an uneven shape is formed on the rear surface, various known plate-like materials (sheet-like materials) which propagate the light incident from the end surface to the in-plane direction can be used.

Accordingly, the light guiding plate 14 may be formed by using resins having high transparency, such as polyethylene terephthalate, polypropylene, and polycarbonate, an acrylic resin such as polymethyl methacrylate, benzyl methacrylate, a polymethacryl styrene (MS) resin, a cycloolefin polymer, a cycloolefin copolymer, and cellulose acylate such as cellulose diacetate or cellulose triacetate, like light guiding plates used in known backlight devices. It is required for the light guiding plate 14 to have a refractive index higher than that of air.

Here, in the present invention, it is preferable that the polarization of light to be emitted to the front is not affected by the light guiding plate. For example, in the display device 10 of the present invention, it is preferable that when polarized sunglasses are used, the polarization of light to be emitted to the front is affected by the light guiding plate, and an image to be visually recognized is prevented from being colored.

In consideration of this point, it is preferable that Re(λ) of the light guiding plate 14 is set not to cause color unevenness, and therefore, light guiding plates formed of a cycloolefin polymer, a cycloolefin copolymer, an acrylic resin, polyethylene terephthalate, and the like may be suitably used.

In consideration of this point, for example, the smaller Re(λ) of the light guiding plate 14 is, the more preferable it is. Specifically, Re(λ) of the light guiding plate 14 is preferably 0 to 100 nm. In contrast, in a case where Re(λ) of the light guiding plate 14 is 6000 nm or more, retardation is very large and color unevenness is hardly caused, and thus this case is preferable.

As described above, in the display device 10 of the present invention, in a case where the light source 16 is turned on, 80% of light emitted from the light guiding plate 14 is emitted from the visible surface 14b to a region at a wide angle of 30° (a two-dot chain line in FIG. 2) or more with respect to the normal line N of the light guiding plate 14 (a dashed line in FIG. 2). That is, in a case where the light source 16 is turned on, as shown by the arrow Z, 80% of light from the light guiding plate 14 is emitted at an angle of 30° or more with respect to the normal line N from the visible surface 14b. In the following description, the light emission is also referred to as "oblique emission".

In the display device 10, for example, the oblique emission from the light guiding plate 14 is realized by at least one principal surface of the light guiding plate having an uneven shape.

In the example shown in the drawing, by forming triangular grooves 20 long in the same direction as the longitudinal direction of the light source 16 on the rear surface 14a of the light guiding plate 14, the rear surface 14a is formed into an uneven shape and the oblique emission is realized. Accordingly, the light source 16 and the groove 20 are parallel to each other. The longitudinal direction of the groove 20 coincides with one direction of the arrangement direction of pixels in the display element 12.

As an example, the grooves 20 are isosceles-triangular grooves with the surface of the rear surface 14a as a bottom surface (bottom side), that is, grooves formed by cutting the rear surface 14a of the light guiding plate 14 in a substantially long V shape.

Figure 3:
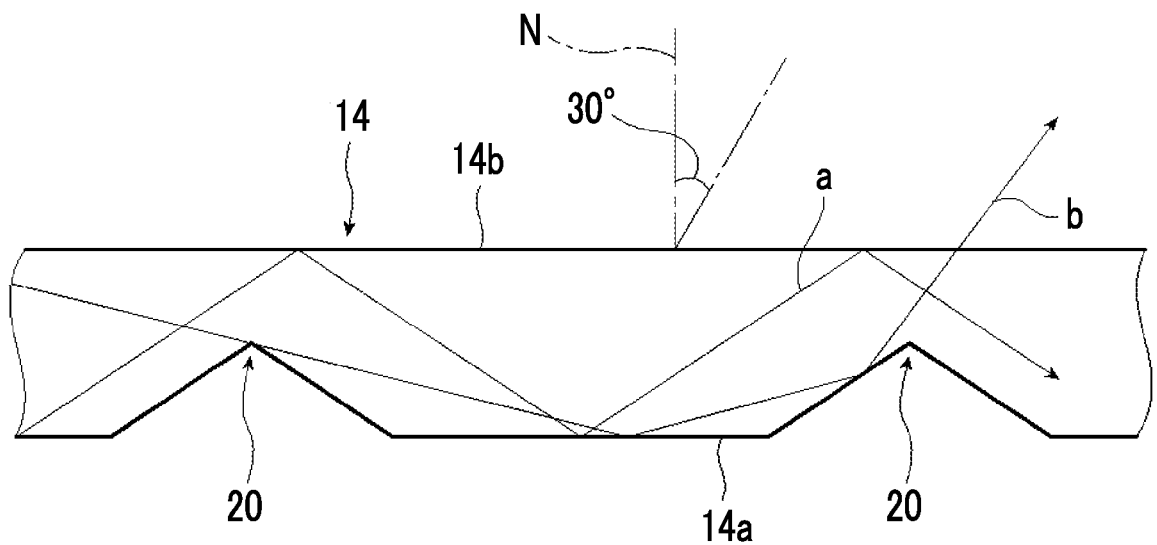
FIG. 3 is a partially enlarged view of FIG. 2.

In a case where the light source 16 is turned on, light emitted from the end surface of the light source 16 is made incident on the light guiding plate 14 and as conceptually shown by an arrow a in FIG. 3, the light is repeatedly reflected in the light guiding plate 14 and propagates in the light guiding plate 14.

Here, a part of the light propagating in the light guiding plate 14 is made incident on the grooves 20 formed on the rear surface 14a and reflected. As described above, the groove 20 has a triangular shape. Accordingly, as shown by an arrow b in FIG. 3, the light reflected by the grooves 20 travels to the visible surface 14b at a certain angle with respect to the normal line N and is emitted from the visible surface 14b. Thus, in a case where the light source 16 is turned on, the light is obliquely emitted from the light guiding plate 14.

In the display device 10, in a state in which the light source 16 is turned off, the image displayed on the display element 12 is visually recognized by a user through the light guiding plate 14. Accordingly, in this case, a display is performed at a wide viewing angle in the display element 12.

In contrast, in the display device 10 of the present invention, in a case where the light source 16 is turned on, light emitted from the light source 16 is obliquely emitted from the light guiding plate 14 in the optical switching element. That is, in the optical switching element the display device 10 of the present invention, 80% or more of light, which is emitted from the light source 16 and then is emitted from the light guiding plate, 14 is emitted to a region at an angle of 30° or greater with respect to the normal line N on the visible surface 14b side as shown by the arrow Z in FIG. 2.

Therefore, in a case where the display device 10 is observed in the oblique direction in a state in which the light source 16 is turned on, resultantly, the light obliquely emitted from the light guiding plate 14 is also observed. Thus, the contrast of a display image is significantly lowered and thus an appropriate image can be visually recognized. On the other hand, only less than 20% of light from the light guiding plate 14 is emitted from a region within 30° with respect to the normal line N of the light guiding plate 14. Accordingly, in a case where the display device 10 is visually recognized from the front, the image can be visually recognized with good visibility without disturbance of the light from the light guiding plate 14. That is, in the display device 10, the viewing angle is significantly limited by turning on the light source 16 and a display at a narrow viewing angle can be performed.

Therefore, according to the display device 10 of the present invention, a display at a wide viewing angle and a display at a narrow viewing angle can be switched by simple operation and control for turning on or turning off the light source 16.

In the display device 10, in a state in which light is obliquely emitted, that is, the light quantity distribution of light to be emitted at an angle with respect to the normal line N of the light guiding plate 14 on the visible surface 14b side can be controlled by adjusting the state of the uneven shape formed on the rear surface 14a of the light guiding plate 14.

On a "flat surface" without unevenness, light propagating in the light guiding plate is guided at an angle of equal to or more than the critical angle and the total reflection is repeated not to emit light to the outside of the light guiding plate. However, in a case where the surface is changed from a flat surface to an oblique surface, a light guiding component at an angle of equal to or less than the critical angle starts to be emitted to the outside of the light guiding plate at a wide angle. Further, in a case where the oblique angle increases, the proportion of light emitted to the outside of the light guiding plate is changed from a wide angle to a narrow angle. In this manner, the light quantity distribution of light to be emitted can be controlled by adjusting the state of the uneven shape on the surface of the light guiding plate (rear surface and/or visible surface).

As a method of adjusting the state of the uneven shape, for example, a method of adjusting at least one of the shape, interval, density, distribution state (regularly or irregularly), or formed positions of concave portions and/or convex portions constituting the uneven shape, may be used.

Figure 4:
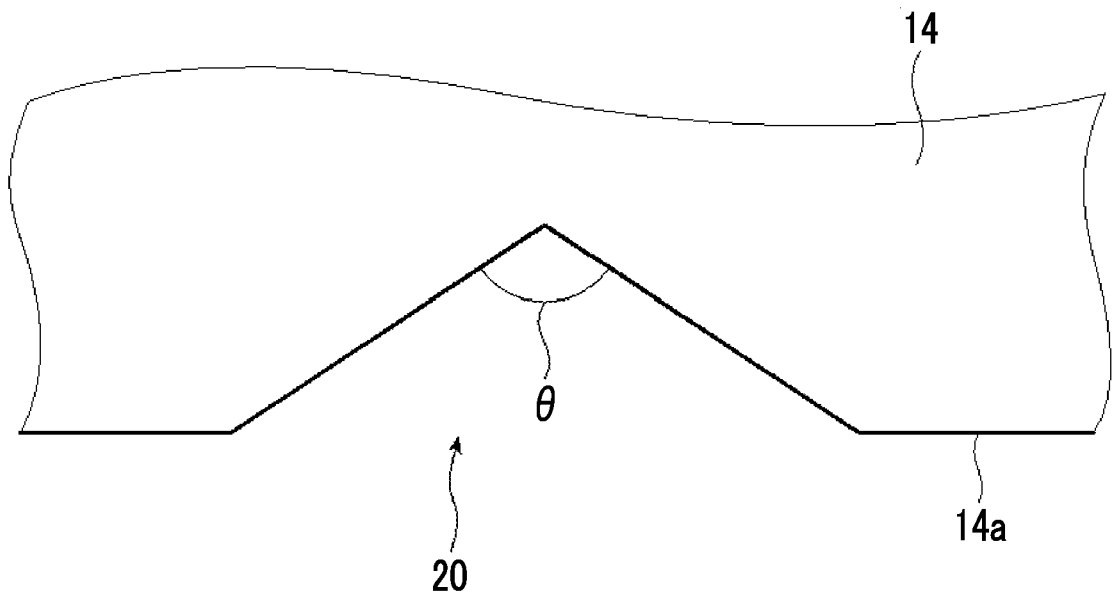
FIG. 4 is a partially enlarged view of FIG. 2.

For example, as in the display device 10 shown in FIG. 1 or the like, by forming triangular grooves on the rear surface 14a (on the principal surface of the light guiding plate 14), in a case where the rear surface 14a is formed into an uneven shape, for example, as conceptually shown in FIG. 4, the state of the oblique emission can be adjusted by adjusting the angle θ of the apex angle of the triangle.

According to the investigation of the present inventors, by setting the angle θ of the apex angle of the triangle to 100° to 150°, suitably, 80% or more of the light emitted from the light guiding plate 14 can be emitted to a region at an angle of 30° or more with respect to a normal line N on the visible surface 14b of the light guiding plate 14.

By setting the angle θ of the apex angle of the triangle to 100° or more, the direction of light emission from the visible surface 14b can be more suitably set to a region at a wide angle of 30° or more with respect to the normal line N and 80% or more of the light emitted from the light guiding plate 14 can be more reliably emitted to a region at an angle of 30° or more with respect to the normal line N on the visible surface 14b of the light guiding plate 14.

On the other hand, as the angle θ increases, an angle of light with respect to the normal line N in the emission direction the from the visible surface 14b increases. However, in a case where there is an excessively large amount of components in which the angle of light with respect to the normal line N in the emission direction is large, the amount of light components to be emitted in a direction close to the just side (in a plane direction of the visible surface 14b) is increased and there is a possibility that the visibility from the oblique direction in which the angle with respect to the normal line N is small may not be sufficiently lowered. That is, there is a possibility that the limitation of the viewing angle may be decreased. In contrast, the amount of the component in which the angle of light with respect to the normal line N in the emission direction is large is appropriately set by setting the angle θ to 150° or less, and thus the viewing angle can be sufficiently stably limited.

In consideration of the above point, the angle θ of the apex angle of the triangular groove 20 is preferably 100° to 150° as described above and more preferably 110° to 140°.

The limitation of the viewing angle may be small and in a case where the visibility may be lowered only in the direction close to the just side and having a large angle with respect to the normal line, the angle θ may be more than 150°.

In the display device 10 of the present invention, as conceptually shown in FIG. 2, it is preferable to form an uneven shape on the rear surface 14a such that the contrast (contrast ratio) measured from a 45° direction with respect to the normal line N (broken line B) is 10 or less and particularly 5 or less in a case where the light source 16 is turned on.

By forming the uneven shape on the rear surface 14a such that the contrast measured from a 45° direction with respect to the normal line N is 10 or less, in a case where the viewing angle is narrowed by turning on the light source 16, the visibility in a case of visual recognition from the side is further lowered and thus the visual recognition of a display image from the lateral direction can be suitably prevented.

In the present invention, the contrast in the 45° direction with respect to the normal line N may be obtained in the same manner as in the contrast measurement of a normal display device. For example, the contrast may be obtained by calculating a ratio between a white display and a black display using a luminance meter (for example, BM-5A manufactured by TOPCON CORPORATION).

Although described later, in the display device 10 shown in FIG. 1, the viewing angle is narrowed in a case where the light source 16 is turned on only in a direction orthogonal to the longitudinal direction of the groove 20.

Accordingly, as shown in the example of the drawing, in a case where the uneven shape is formed on the principal surface of the light guiding plate by the long grooves 20 (long convex portions), the contrast measured from the 45° direction with respect to the normal line N may be 10 or less in both directions orthogonal to the grooves 20.

Figure 5:
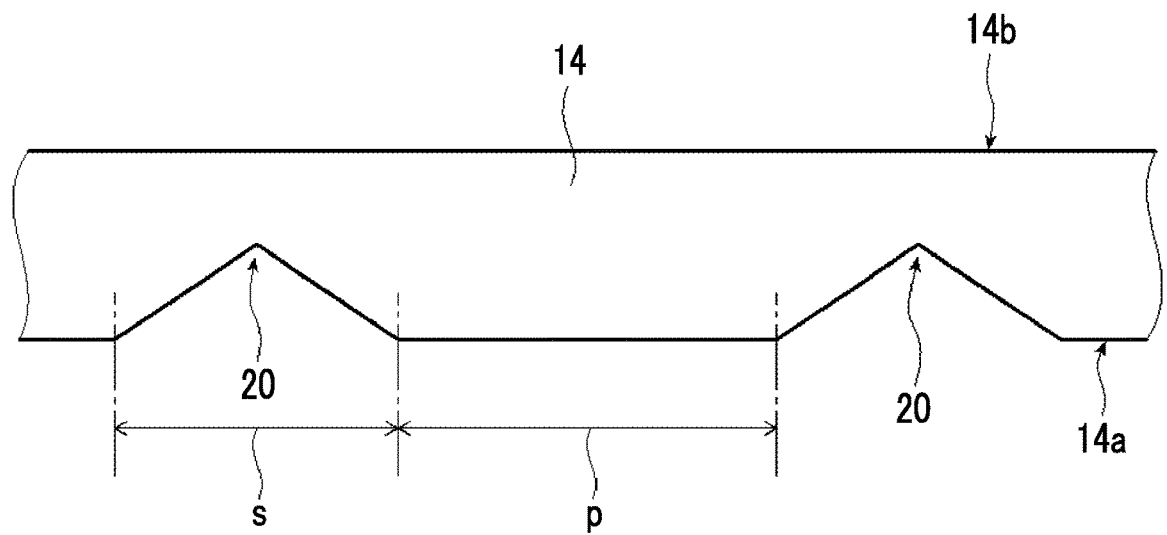
FIG. 5 is a partially enlarged view of FIG. 2.

In the present invention, a size s of the groove 20 shown in FIG. 5 may be appropriately set according to one or more of the pixel size of the display element 12, the size of the display device 10, the limitation of the required viewing angle, the image quality required for the display device 10, and the like. As shown in FIG. 5, the size s of the groove 20 is the size of the groove 20 in a direction orthogonal to the longitudinal direction of the groove 20 on the rear surface 14a of the light guiding plate 14.

Here, according to the investigation of the present inventors, the size s of the groove 20 is preferably smaller than the pixel size of the display element 12 and is particularly preferably 0.5 times or less the pixel size of the display element 12. Alternatively, the size s of the groove 20 is preferably 1 to 20 times the pixel size of the display element 12 and more preferably 2 to 10 times the pixel size of the display element.

By setting the size s of the groove 20 in the above range, the groove 20 is prevented from interfering with the pixel of the display element 12 and thus image quality can be prevented from being lowered due to image blur and/or bleeding caused by the interference between the pixel and the groove 20 or the like.

By quasi-periodically or randomly forming the grooves 20 instead of periodically forming the grooves, the interference between the grooves 20 and the pixels of the display element 12 may be prevented.

In a case where the number of grooves 20 are too small or the formation density of the grooves is too low, there is a possibility that the effect of narrowing the viewing angle may not be sufficiently obtained. On the other hand, since the grooves 20 act as a factor to cause disturbance of visual recognition of a display image of the display element 12 by a user or to lower the transparency of the light guiding plate 14, in a case where the number of grooves 20 are too large or the formation density of the grooves is too high, the image quality of a display image of the display device 10 is lowered.

Therefore, it is preferable that a plurality of grooves 20 are formed with certain intervals p.

In consideration of the above point, in the display device 10, the plurality of grooves 20 are formed and the area ratio of the grooves 20 to the rear surface 14a (the surface on which the grooves 20 are formed) is preferably 10% to 70% and more preferably 15% to 50%.

The area ratio of the grooves 20 is an area ratio of the grooves 20 on the surface of the rear surface 14a on which the grooves 20 are formed.

For the same reason, the interval p between the grooves 20 is preferably 1 to 100 times the pixel size of the display element 12 and more preferably 10 to 50 times the pixel size of the display element. In a case where the effect of narrowing the viewing angle is regarded as important, it is preferable to densely form the grooves 20 by narrowing the interval p. In a case where the image quality (transparency) in observation from the front is regarded as important, it is preferable to non-densely form the grooves 20 by widening the interval p.

As described later, in the configuration in which the rear surface 14a is formed into an uneven shape with dot-like concave portions (convex portions), the interval p is an interval p which is a distance between the nearest concave portions.

The grooves 20 may be regularly or irregularly formed and a region in which the grooves are regularly formed and a region in which the grooves are irregularly formed may be mixed.

Further, the density of the formed grooves 20 may be entirely homogeneous or there may be variation in the formation density of the grooves 20 on the rear surface 14a in the plane direction such that the formation density of the grooves is low near the light source 16 and the formation density of the grooves is high in a region apart from the light source 16.

Further, the depth of the groove 20 may be appropriately set according to the angle θ of the apex angle of the groove 20, the size of the groove 20, the area ratio of the groove 20, the interval p of the groove 20, the thickness of the light guiding plate 14, and the like.

Regarding the size s of the groove 20, the area ratio of the groove 20, the interval p of the groove 20, the formation distribution and formation density of the groove 20, the depth of the groove 20 (height for the convex portion), and the like, the same is applied to concave portions, such as a circular arc-shaped groove and a conical concave portion, formed in a dot-like shape, long convex portions having a triangular and circular arc-shaped cross section, dot-like convex portions having a spherical segment or conical shape, convex portions formed by particles, and the like, which will be described later.

That is, regarding the size s and interval p of the concave portion or the convex portion, or the like, which will be described later, the groove 20 in the above description may be replaced with the concave portion, the convex portion, or the like.

In the display device 10 shown in FIG. 1 or the like, the rear surface 14a of the light guiding plate 14 is formed into an uneven shape, and thus the grooves 20 which are long in the same direction as the longitudinal direction of the light source 16 (the pixel arrangement direction of the display element 12), that is, the grooves 20 parallel to the light source 16 are formed on the rear surface 14a.

However, the present invention is not limited thereto and the concave portions for forming the rear surface of the light guiding plate 14 into an uneven shape can adopt various shapes.

For example, the rear surface 14a may be formed into an uneven shape by forming circular arc-shaped grooves in the same manner as in the formation of the grooves 20 instead of the triangular grooves 20.

Alternatively, the rear surface 14a may be formed into an uneven shape by forming a plurality of one or more of a conical concave portion, a pyramidal concave portion, and a spherical segment-shaped concave portion on the rear surface 14a in a dot-like shape (sea island shape) to be separated from each other.

Further, the rear surface 14a may be formed into an uneven shape by mixing these concave portions having various shapes.

In the configuration in which the rear surface 14a is formed into an uneven shape by forming the long grooves 20, the light emission angle can be adjusted only in a direction orthogonal to the longitudinal direction of the groove 20. That is, in the configuration using the long grooves 20, oblique emission is made only in a direction orthogonal to the longitudinal direction of the groove 20 and thus the viewing angle can be narrowed only in either the machine direction or the lateral direction (H direction or L direction) of the display device 10.

In contrast, in the configuration in which the rear surface 14a is formed into an uneven shape by using dot-like concave portions such as conical and pyramidal convex portions, the light emission angle can be adjusted in both the longitudinal direction of the light source 16 and a direction orthogonal to the longitudinal direction of the light source 16. That is, in the configuration using the dot-like convex portions, oblique emission is performed in four directions orthogonal to one another with the normal line N as a center and in all directions according to the shape of the convex portion or the like, and thus the viewing angle can be narrowed in both the machine and the lateral directions of the display device.

Regarding this point, the configuration in which the rear surface 14a is formed into an uneven shape by forming the convex portions on the rear surface 14a which will be described later is the same.

The light guiding plate 14 having concave portions such as the grooves 20 on the rear surface 14a may be prepared by a known method according to the material for forming the light guiding plate 14.

Examples thereof include a method of performing cutting and drilling on the light guiding plate 14, a method of embossing (emboss processing) a sheet material which becomes the light guiding plate 14, a method of preparing the light guiding plate 14 by injection molding, and a method of preparing the light guiding plate 14 by extrusion molding.

In the above example, the rear surface 14a is formed into an uneven shape by forming concave portions such as the grooves 20 on the rear surface 14a of the light guiding plate 14.

In the present invention, in addition to the above methods, the rear surface 14a may be formed into an uneven shape by forming convex portions on the rear surface 14a.

Figure 6:
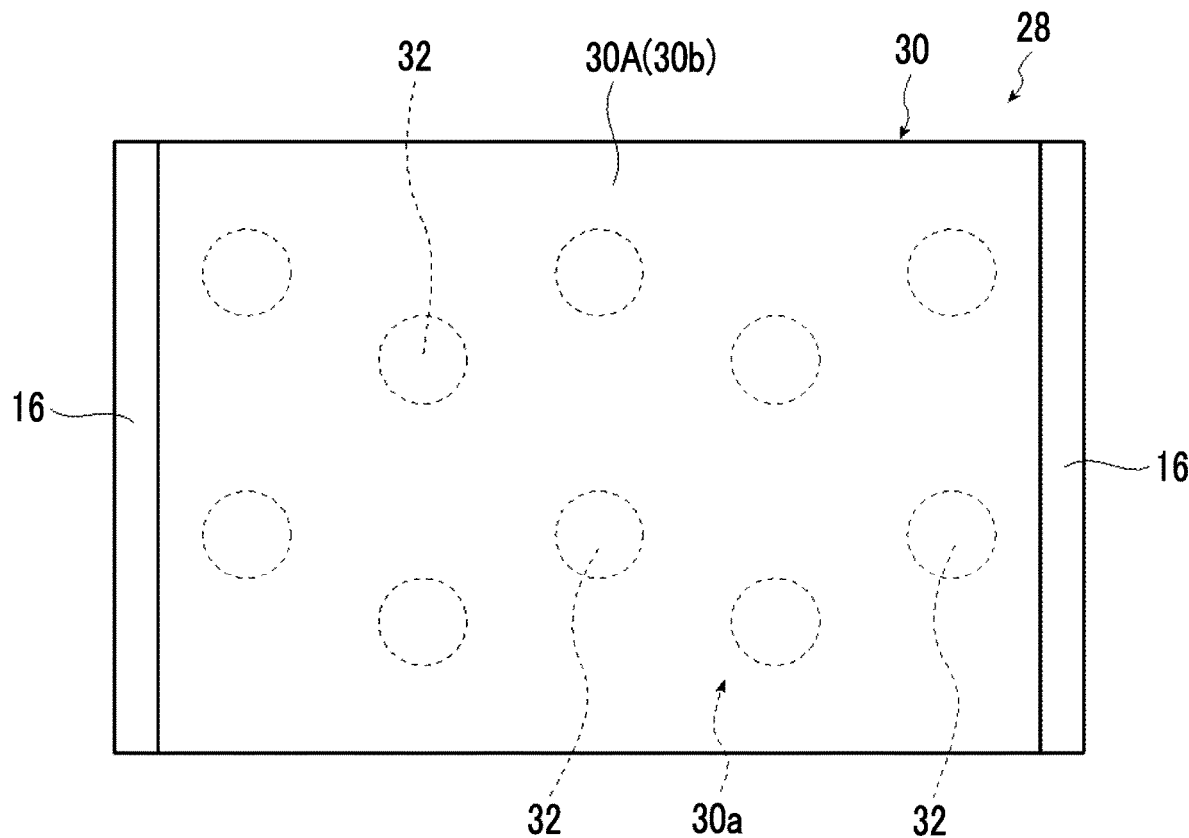
FIG. 6 is a schematic front view showing another example of the display device of the present invention.
Figure 7:
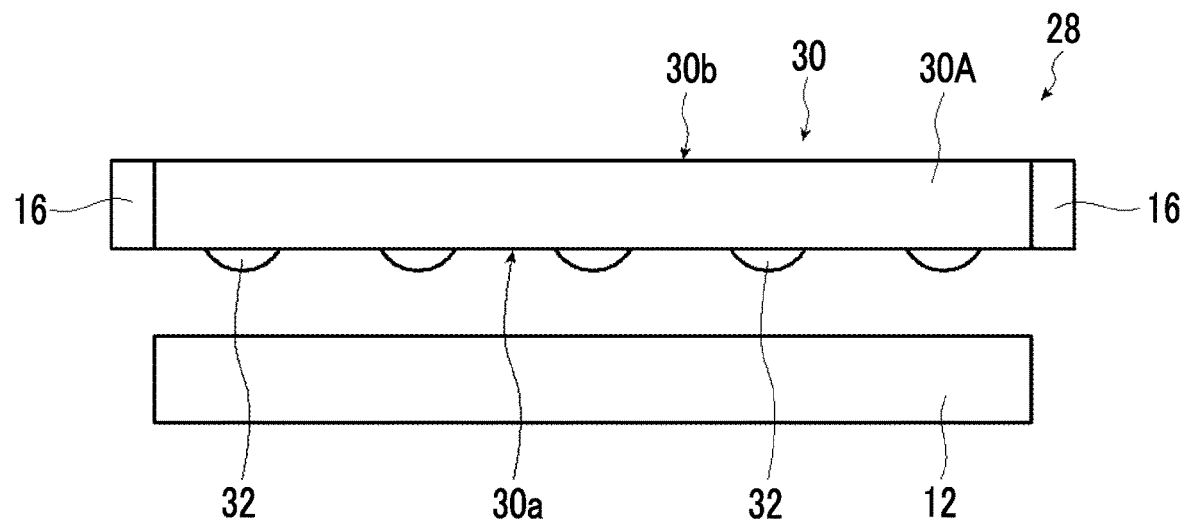
FIG. 7 is a schematic side view showing the display device shown in FIG. 6.

FIG. 6 shows a front view of an example thereof and FIG. 7 shows a side view of the example. Since a display device 28 shown in FIGS. 6 and 7 has a plurality of same members as in the above-described display device 10, the same symbols are attached to the same members and different members are mainly described.

The display device 28 shown in FIGS. 6 and 7 has a display element 12, a light guiding plate 30, and a light source 16. The light guiding plate 30 is constituted of a main body 30A of the light guiding plate 30 and convex portions 32 formed on one principal surface of the main body 30A. In the display device 28, the optical switching element in the present invention is constituted of the light guiding plate 30 having the convex portions 32 and the light source 16.

In the display device 28, a rear surface 30a of the light guiding plate 30 is formed into an uneven shape by forming a plurality of spherical segment-shaped convex portions 32 on one principal surface of the main body 30A having a flat plate-like shape. The rear surface 30a and the visible surface 30b are the same as the above-described rear surface 14a and visible surface 14b in the light guiding plate 14.

In a case where the rear surface 30a is formed into an uneven shape by forming the convex portions 32 on the rear surface 30a in this manner, as in the light guiding plate 14 of the above-described display device 10, the light reflected by the convex portions 32 travels to the visible surface 30b at a certain angle with respect to the normal line N and is emitted from the visible surface 30b (refer to FIG. 3).

Therefore, in a case where the light source 16 is turned on, 80% or more of the light emitted from the light guiding plate 30 can be emitted (obliquely emitted) to a region at an angle of 30° or more with respect to the normal line N on the visible surface 30b. Thus, the display device 28 can switch a normal wide viewing angle display in a case where the light source 16 is turned off and a narrow viewing angle display in a case where the light source 16 is turned on.

The size s (diameter), area ratio, interval p, and the like of the convex portion 32 may be appropriately set according to the size of the light guiding plate 30 and the like. However, the size of the convex portion 32 is preferably the same as the size of the groove 20 of the light guiding plate 14 as described above.

Figure 8:
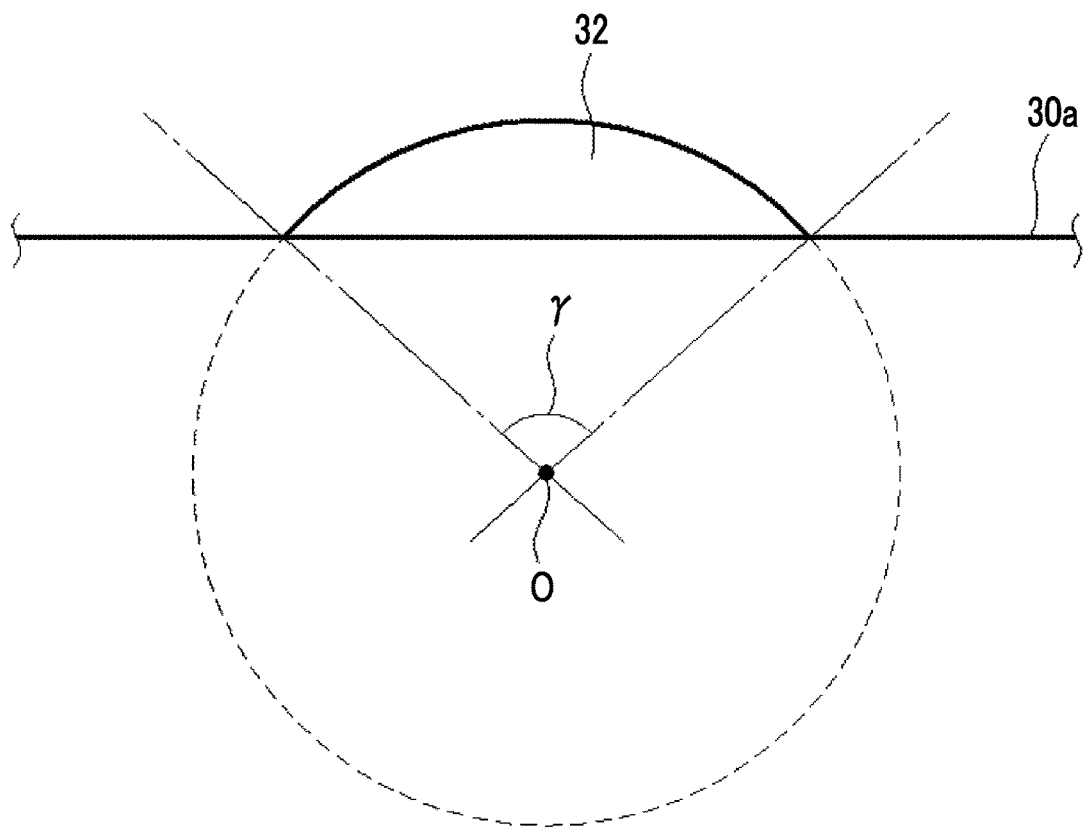
FIG. 8 is a concept view for illustrating the display device shown in FIG. 6.

According to the investigation of the present inventors, in a spherical segment-shaped convex portion 32, an internal angle $\gamma$ conceptually shown in FIG. 8 is preferably 20° to 80° and more preferably 30° to 70°.

That is, it is preferable to form the spherical segment-shaped convex portion 32 such that an internal angle $\gamma$ is 20° to 80° according to the size s, area ratio, interval p, and the like of the convex portion 32. Alternatively, the size s, area ratio, interval p, and the like of the convex portion 32 may be set according to the internal angle $\gamma$ of the spherical segment-shaped convex portion 32.

As the internal angle $\gamma$ decreases, the angle of light with respect to the normal line N in the emission direction from the visible surface 30b increases. However, in a case where there is an excessively large amount of components in which the angle of light with respect to the normal line N in the emission direction is large, the amount of light components to be emitted in a direction close to the just side (in a plane direction of the visible surface 30b) is increased and there is a possibility that the visibility from the oblique direction in which the angle with respect to the normal line N is small may not be sufficiently lowered. In contrast, by setting the internal angle $\gamma$ to 20° or more, the amount of the component in which the angle of light with respect to the normal line N in the light emission direction is large is appropriately adjusted and thus the viewing angle can be stably limited. Accordingly, in a case where the limitation of the viewing angle may be small, the internal angle $\gamma$ may be less than 20°.

On the other hand, by setting the internal angle $\gamma$ to 80° or less, the direction of light emission from the visible surface 30b can be more suitably set to a region at a wide angle of 30° or more with respect to the normal line N, and 80% or more of the light emitted from the light guiding plate 30 can be more reliably emitted to a region at an angle of 30° or more with respect to the normal line N on the visible surface 30b.

In the configuration in which the rear surface 30a is formed into an uneven shape by forming the convex portions on the rear surface 30a of the light guiding plate 30, the shape of the convex portions is not limited to the spherical segment shape shown in the example in the drawing and convex portions having various shapes can be used.

For example, by forming conical or pyramidal convex portions on the rear surface 30a of the light guiding plate 30 into a dot-like shape, the rear surface 30a may be formed into an uneven shape. In addition, the rear surface 30a may be formed into an uneven shape by forming long columnar convex portions having a triangular and circular arc-shaped cross section in the same manner as the formation of the above-described grooves 20.

The rear surface 30a may be formed into an uneven shape by mixing these convex portions having various shapes. Further, the rear surface 30a may be formed into an uneven shape by mixing the above-described concave portion and these convex portions.

The main body 30A of the light guiding plate 30 may be formed using the same material as the material of the above-described light guiding plate 14. In addition, the refractive index is higher than that of air as in the light guiding plate 14.

The convex portion 32 can be formed using various materials as long as the material has a refractive index higher than that of air and sufficient transparency. For example, various materials exemplified in the light guiding plate 14 may be used. Accordingly, the light guiding plate 30 and the convex portion 32 may be formed using the same material or may be integrally molded.

As a method of forming the convex portions 32, processing of pressing a mold while heating the flat plate-like main body 30A to form the main body 30A into a shape according to the shape of the mold, so-called emboss processing may be used.

As another method of forming the convex portions 32, for example, a method of applying a resin composition which becomes the convex portion to the surface of the flat plate-like main body 30A, drying the resin composition, and then curing the resin composition by ultraviolet emission or the like while molding the resin composition with a mold, a so-called imprinting method, can be used.

Alternatively, the convex portions may be formed by filling a mold with a resin composition which becomes the convex portion, transferring the molded resin composition on a support, and curing the resin composition by ultraviolet emission or the like.

Here, as the material for forming the convex portions 32, in addition to the above-described materials, a curable liquid crystal may be suitably used.

In a case of forming the convex portions 32 using a curable liquid crystal, the emission direction of the light from the visible surface 30b can be adjusted by adjusting the alignment direction of the liquid crystal, and thus the effect of narrowing the viewing angle can be further improved by controlling a direction in which the viewing angle of the light is narrowed.

As long as the curable liquid crystal has a refractive index higher than that of air (which is possible only in one direction of birefringence) and sufficient transparency as described above, various known curable liquid crystals can be used.

For example, one obtained by aligning and curing a cholesteric liquid crystal compound in a spherical segment shape as shown in examples which will be described later, or further filling spherical convex portions with a transparent material to be flattened can be used. That is, spherical segment-shaped convex portions formed by fixing a cholesteric liquid crystalline phase are suitably used. Since the cholesteric liquid crystalline phase selectively reflects a specific wavelength, only light having a wavelength corresponding to the wavelength of the light source 16 can be reflected and thus it is possible to suppress effect on a display by the display device 10. Particularly, in a case where the selective reflection wavelength of the cholesteric liquid crystalline phase is set to an infrared wavelength, since the propagating light of the light guiding plate 30 is made incident on the cholesteric liquid crystalline phase in an oblique direction, the reflection wavelength is shifted to a short wavelength side and thus guided light of a wavelength of red is emitted. On the other hand, since the light to be incident on the light guiding plate 30 from the visible surface 30b or the rear surface 30a is made incident at an oblique angle larger than the critical angle due to the effect of the refractive index, visible light is not affected by the cholesteric liquid crystalline phase and the effect on a display by the display device 10 can be suppressed to be small.

The light guiding plate 30 having convex portions such as the convex portions 32 on such a rear surface 30a may be prepared by a known method according to the material for forming the light guiding plate 30 (main body 30A and convex portions 32).

Examples thereof include a method of forming the convex portions 32 to the main body 30A by printing, a method of transferring a structure which becomes the convex portions 32 to the light guiding plate 30, a method of performing cutting drilling on a sheet-like material which becomes the main body 30A, a method of performing embossing on a sheet-like material which becomes the main body 30A, a method of preparing the light guiding plate 30 by injection molding, and a method of preparing the light guiding plate 30 by extrusion molding.

Further, the convex portions 32 may be formed on the main body 30A by performing jetting by ink jet to form spherical segment-shaped resin compositions, curing the resin compositions by ultraviolet emission or the like. The spherical segment-shaped resin composition may have a cholesteric liquid crystalline phase which reflects light having a specific wavelength and in this case, it is preferable that an alignment film is provided on the rear surface 30a of the main body 30A to perform jetting thereon.

In a case where a curable liquid crystal is used to form the convex portions 32 or the like, the liquid crystal may be aligned by a known method such as a method of forming an alignment film.

In the convex portions 32 formed by a method by emboss processing or imprinting may be disposed, a layer formed by fixing a cholesteric liquid crystalline phase may be disposed on one inclined surface. A configuration in which layers formed by fixing a cholesteric liquid crystalline phase are provided on both inclined surfaces may be adopted.

In the configuration in which the layer formed by fixing a cholesteric liquid crystalline phase is provided on one inclined surface of the convex portion 32, mainly, the light guided from the direction of the layer formed by fixing a cholesteric liquid crystalline phase is reflected. On the other hand, by disposing the layers formed by fixing a cholesteric liquid crystalline phase both inclined surfaces of the convex portion 32, light can be reflected from a plurality of left and right directions. A suitable configuration can be selected according to arrangement of the light source only on a right or left side or on both sides. In this case, the reflection center wavelength is preferably 400 to 900 nm and more preferably 750 nm or more from the above-described viewpoint.

Figure 9:
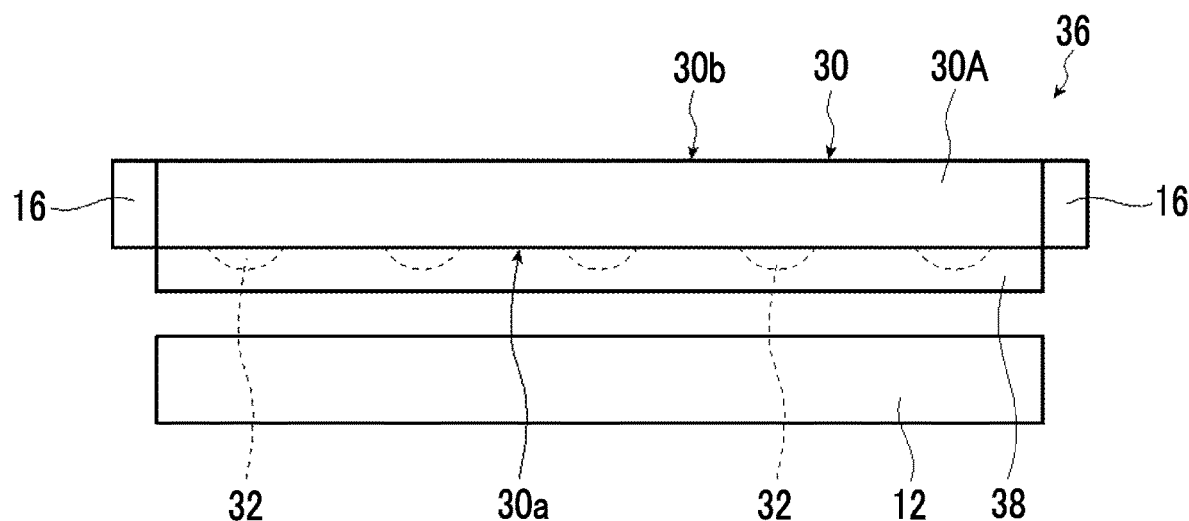
FIG. 9 is a schematic side view showing still another example of the display device of the present invention.

FIG. 9 shows still another example of the display device of the present invention. Since a display device 36 shown in FIG. 9 has a plurality of same members as in the above-described display device 28, the same symbols are attached to the same members and different members are mainly described.

The display device 36 also has a display element 12, a light guiding plate 30 having convex portions 32 formed on a rear surface 30a, and a light source 16. The display device 36 further has a coating layer 38.

The coating layer 38 has a refractive index higher than that of air, is formed of a material having a refractive index different from the refractive index higher than of the convex portion 32 and is formed to cover the rear surface 30a of the light guiding plate 30.

As in the display device 28, in the display device 36, since the light guiding plate 30 has the convex portions 32 on the rear surface 30a, 80% or more of the light emitted from the light guiding plate 30 can be emitted (obliquely emitted) to a region at an angle of 30° or more with respect to the normal line N on the visible surface 30b by turning on the light source 16. Thus, the display device 36 can switch a normal wide viewing angle display in a case where the light source 16 is turned off and a narrow viewing angle display in a case where the light source 16 is turned on.

Here, it is preferable that the light guiding plate 30 has a high transmittance in the front, that is, in the direction of the normal line N. However, since the light guiding plate 30 has unevenness on the rear surface 30a, the light, which travels to the front, of the light incident on the convex portions 32 is also refracted and the transparency may be lowered depending on the uneven state to cause bleeding or blur in a display image in some cases.

In contrast, the display device 36 has the coating layer 38 which covers the rear surface 30*a* of the light guiding plate 30 and has a refractive index different from the refractive index of the convex portion 32.

Therefore, even in a case where light in a front direction is made incident on the convex portions 32 in the display device 36, the amount of refraction can be reduced and lowering of the transparency of the light guiding plate 30 can be suppressed. Although the light component emitted at a sufficient angle with respect to the normal line N is slightly reduced by providing the coating layer 38, 80% or more of the light emitted from the light guiding plate 30 can be sufficiently emitted to a region at a wide angle of 30° or more with respect to the normal line N on the visible surface 30*b* of the light guiding plate 30 by the action of the convex portions 32.

Accordingly, in the case of preferentially considering the image quality of the display device 36, it is preferable to provide the coating layer 38.

In a case where the refractive index of the convex portion 32 and the refractive index of the coating layer 38 are slightly different from each other, lowering of the transparency of the light guiding plate 30 can be suppressed. Here, a difference in refractive index between the convex portion 32 and the coating layer 38 is preferably 0.05 to 0.5 and more preferably 0.08 to 0.3. Either the refractive index of the convex portion 32 or the refractive index of the coating layer 38 may be larger than the other.

By setting a difference in refractive index between the convex portion 32 and the coating layer 38 within the above range, the viewing angle can be suitably narrowed and lowering of the transparency of the light guiding plate 30 can be sufficiently suppressed by performing sufficient oblique emission.

As the material for forming the coating layer 38, various materials can be used as long as the material has sufficient transparency and the refractive index of the convex portion 32 and the refractive index of the coating layer are different from each other.

As the material for forming the coating layer 38, for example, known materials having a low refractive index can be used. Specifically, fluorine containing curable resins and compositions containing fine inorganic particles described in JP2007-298974A, and hollow fine silica particle containing coatings having a low refractive index described in JP2002-317152A, JP2003-202406A, and JP2003-292831A can be suitably used.

As the material for forming the coating layer 38, known materials having a middle and/or high refractive index can also be used. Specifically, various materials shown in paragraphs [0074] to [0094] of JP2008-262187A can also be used.

Such a coating layer 38 may be prepared by forming a layer which covers the rear surface 30*a* of the light guiding plate 30 and has a flat surface by a known film formation method such as coating after preparing the light guiding plate 30 having the convex portions 32.

Figure 10:
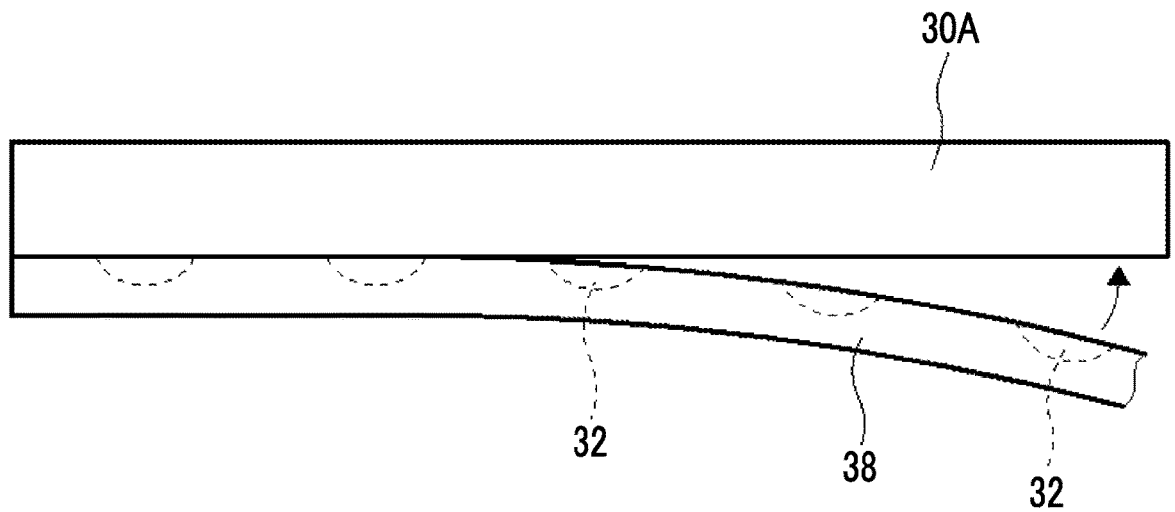
FIG. 10 is a concept view for illustrating an example of a method of manufacturing the display device shown in FIG. 9.

As a preferable method of preparing the light guiding plate 30 on which coating layer 38 is laminated, a method conceptually shown in FIG. 10 may be used.

In this method, first, the coating layer 38 having concave portions corresponding to the convex portions 32 formed thereon is prepared. The coating layer 38 having the concave portions may be prepared in the same manner as the preparation of the light guiding plate 14 having the grooves 20 by, for example, processing using laser. A composition (paint) which becomes the convex portion 32 is prepared.

Next, the concave portions of the coating layer 38 are filled with the composition which becomes the convex portion 32 and the composition is dried and/or cured. The filling of the concave portions with the composition may be performed by a known method using a dispenser or printing. In a case where the convex portions 32 are formed using a curable liquid crystal, it is preferable to fill the concave portions with the composition to align the liquid crystal after forming an alignment film in the concave portions.

Further, as shown in FIG. 10, the coating layer 38 is bonded to the main body 30A while the side on which the convex portions 32 are formed is directed to the main body 30A of the light guiding plate 30, and if necessary, the coating layer 38 and/or the convex portions 32 is cured and the coating layer 38 is laminated to form the light guiding plate 30. In a case where the coating layer 38 has a pressure sensitive adhesive force, the coating layer 38 may be bonded to the main body 30A by using the pressure sensitive adhesive force or an optical clear adhesive (OCA), a transparent pressure sensitive adhesive sheet, and the like may be used.

Such a coating layer 38 can also be used in the configuration using a light guiding plate having concave portions formed on the rear surface of the light guiding plate such as the display device 10 including the above-described light guiding plate 14 having the grooves 20 on the rear surface 14*a* or the like. Accordingly, in this case, it is required that the refractive index of the coating layer 38 is different from the refractive index of the light guiding plate.

In a case where a light guiding plate having concave portions is provided on the coating layer 38, the concave portions may be or may not be filled with the coating layer 38. Alternatively, the concave portions of the light guiding plate may be filled with the above-described curable liquid crystal and may be covered by the coating layer 38.

In the display device 10 having the grooves 20 or the like, in a case where the coating layer 38 is not provided, concave portions such as the grooves 20 may be filled with a curable liquid crystal. In this case, the liquid crystal may be aligned by a known method such as a method using an alignment film.

Such a coating layer 38 can also be used in the configuration in which convex portions are formed in a light guiding plate by using particles which will be described later to form an uneven shape. Accordingly, in this case, it is required that the refractive index of the coating layer 38 is different from the refractive index of the particle.

In the above example, the rear surface 30*a* is formed into an uneven shape by forming the spherical segment-shaped convex portions 32 on the rear surface 30*a* of the main body 30A of the light guiding plate 30. However, as the configuration in which a rear surface is formed into an uneven shape by forming convex portions on the rear surface of a light guiding plate, additionally, various configurations can be used.

Figure 11:
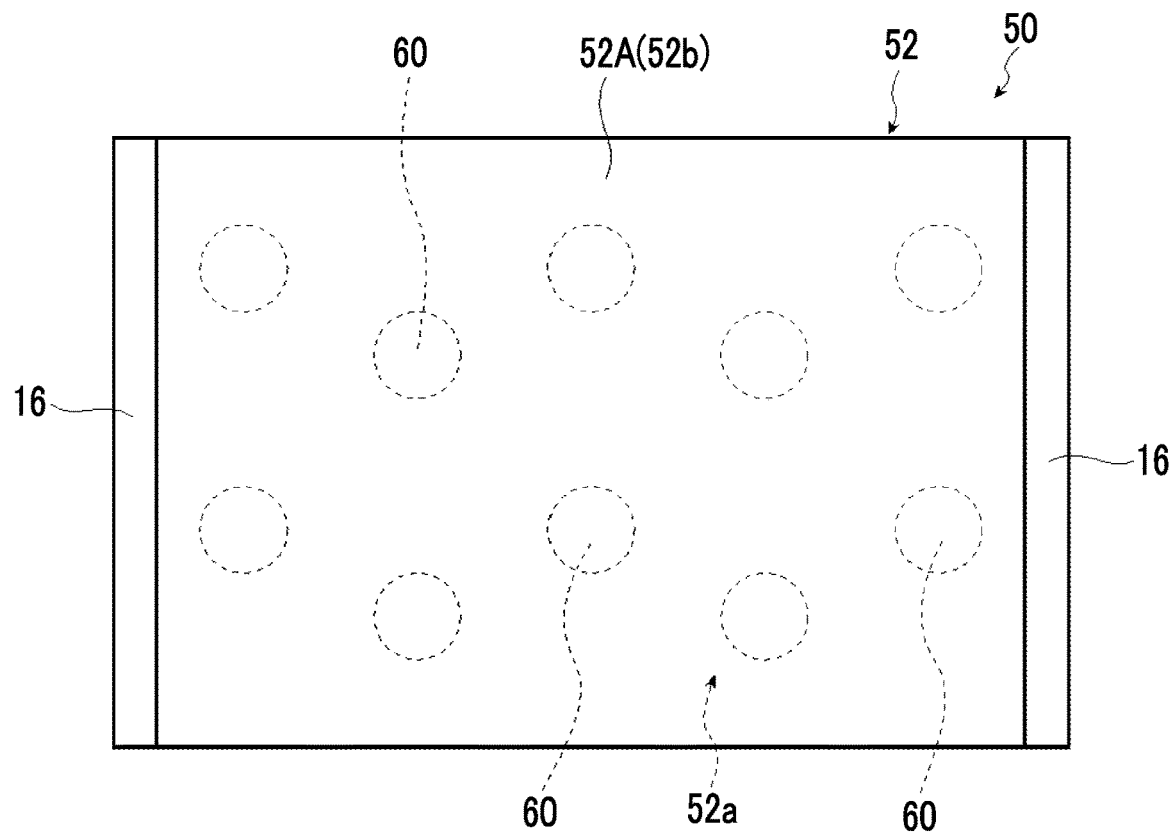
FIG. 11 is a schematic front view showing still another example of the display device of the present invention.
Figure 12:
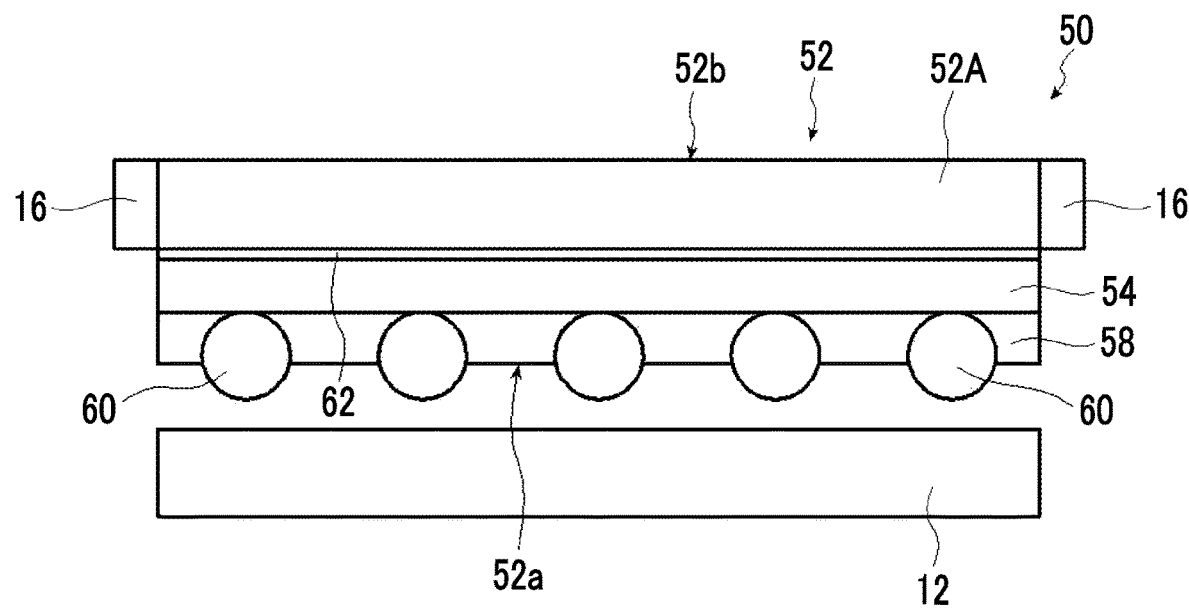
FIG. 12 is a schematic side view showing the display device shown in FIG. 11.

FIG. 11 is a front view showing still another example of the display device and FIG. 12 is a side view of the example. A display device 50 shown in FIGS. 11 and 12 has a plurality of same members as in the above-described display device 10, the same symbols are attached to the same members and different members are mainly described.

The display device 50 shown in FIGS. 11 and 12 has a display element 12, a light guiding plate 52, and a light source 16. The light guiding plate 52 has a main body 52A of the light guiding plate 52, a support layer 54, a binder layer 58, particles 60, and a bonding layer 62. In the display device 50, the optical switching element in the present invention is constituted of the light guiding plate 52 having the particles 60 or the like and the light source 16.

In the light guiding plate 52, convex portions are formed on a rear surface 52a by the particles 60.

The rear surface 52a and a visible surface 52b are the same as the rear surface 14a and the visible surface 14b of the above-described light guiding plate 14.

In the light guiding plate 52, the particles 60 forming the convex portions on the rear surface 52a are held in a state in which the particles are dispersed in the binder layer 58 to be laminated on the support layer 54. The thickness of the binder layer 58 is smaller than the diameter of the particle 60. Accordingly, the particles 60 protrude from the binder layer 58.

The support layer 54 on which the binder layer 58 holding the particles 60 is laminated is bonded to the main body 52A of the light guiding plate 52 by the bonding layer 62.

In the display device 50, by adopting such a configuration, the convex portions are formed on the rear surface 52a of the light guiding plate 52 by the particles 60 protruding from the binder layer 58 and the rear surface 52a is formed in an uneven shape.

In a case where the rear surface 52a is formed in an uneven shape by forming the convex portions on the rear surface 52a by the particles 60 in this manner, as in the light guiding plate 14 of the above-described display device 10 and the light guiding plate 30 of the display device 28, the light reflected by the convex portions formed by the particles 60 also travels to the visible surface 52b at a certain angle with respect to the normal line N and is emitted to from the visible surface 52b (refer to FIG. 3).

Therefore, in a case where the light source 16 is turned on, 80% or more of the light emitted from the light guiding plate 52 can be emitted (obliquely emitted) to a region at an angle of 30° or more with respect to the normal line N on the visible surface 52b. Thus, the display device 50 can switch a normal wide viewing angle display in a case where the light source 16 is turned off and a narrow viewing angle display in a case where the light source 16 is turned on.

The size of the convex portion formed by the particle 60, that is, the size s (diameter), area ratio, interval p, and the like of convex portion of a spherical segment by the particle 60 protruding from the binder layer 58 may be appropriately set according to the size and the like of the light guiding plate 52 but are preferably the same as those of the groove 20 of the light guiding plate 14 as described above. The internal angle γ the convex portion formed by the particle 60 is preferably the same as the internal angle of the convex portion 32 of the above-described light guiding plate 30.

The arithmetic average asperity Ra of the rear surface 52a on which unevenness is formed by the convex portions by the particles 60 is preferably 0.01 to 0.25 μm, more preferably 0.01 to 0.20 and even more preferably 0.01 to 0.15 μm. In the present invention, the arithmetic average asperity Ra may be measured based on JIS B 0601(2001).

The particles 60 may be regularly or irregularly arranged in the principal surface direction of the light guiding plate 52. Further, the density of the particles 60 in the principal surface direction of the light guiding plate 52 may be entirely homogeneous or regions having different densities may be present.

The main body 52A of the light guiding plate 52 may be formed using the same material as the material of the above-described light guiding plate 14. The refractive index is higher than that of air as in the light guiding plate 14.

As the support layer 54, various transparent resin films can be used.

Specific examples of transparent resin films (resin plate, resin sheet) include cellulose acylate films (such as cellulose triacetate film (refractive index: 1.48), cellulose diacetate film, cellulose acetate butyrate film and cellulose acetate propionate film), polyethylene terephthalate films, polyether sulfone films, polyacrylic resin films, polyurethane-based resin films, polyester films, polycarbonate films, polysulfone films, polyether films, polymethylpentene films, polyether ketone films, and (meth)acrylonitrile films.

As the support layer 54, in addition to these films, films formed of materials exemplified in the above-described light guiding plate 14 can also be used.

The material for forming the support layer 54 may be the same as or different from the material for forming the main body 52A.

As the support layer 54, among these, from the viewpoint of high transparency, optically low birefringence, easy manufacturing, and the like, a cellulose acylate film that is generally used as a protective film of a polarizing plate is preferably used and a cellulose triacetate film is more preferably used.

As the support layer 54, a polyethylene terephthalate film is also preferably used for the reasons of excellent the transparency, mechanical strength, leveling, chemical resistance, and moisture resistance, a low cost, and the like. In a case where a polyethylene terephthalate film is used as the support layer 54, the support layer 54 is more preferably subjected to easy adhesion treatment to improve the adhesion strength between the support layer 54 and the binder layer 58 to be laminated thereon.

As the polyethylene terephthalate film, commercially available products can be used and particularly, an optical polyethylene terephthalate film with an easily adhesive layer is suitably used. Examples of a commercially available optical polyethylene terephthalate film with an easily adhesive layer include COSMOSHINE A4100 and A4300 manufactured by TOYOBO CO., LTD.

The thickness of the support layer 54 may be appropriately set according to the thickness of the light guiding plate 52 or the like but is preferably 25 to 1000 μm.

In the present invention, it is particularly preferable that the support layer 54 is formed of a cellulose ester-based film and the film thickness of the cellulose ester-based film is 30 to 70 μm.

In the light guiding plate 52, it is preferable that a difference in refractive index between the bonding layer 62 which will be described later and the support layer 54 is small.

Specifically, a difference in refractive index between the bonding layer 62 and the support layer 54 is preferably 0.05 to 0.3 and more preferably 0.05 to 0.1.

By setting a difference in refractive index between the bonding layer 62 and the support layer 54 to 0.05 to 0.3, light reflection can be prevented at the interface between the bonding layer 62 and the support layer 54.

The binder layer 58 is a matrix for holding the particles 60 and is laminated and bonded to the support layer 54. The binder layer 58 is held in a state in which the particles 60 partially protrude from the binder layer.

The binder layer 58 is formed by using a curable composition containing a curable resin compound. The curable resin compound becomes a light transmitting resin after curing and functions as a binder. Such resin binder is preferably a compound which forms a light transmitting polymer (also referred to as a binder polymer) having a saturated hydrocarbon chain as a main chain after curing by ionizing radiation or the like. Further, the main binder polymer after curing preferably has a crosslinked structure.

Examples of the compound forming a binder polymer having a saturated hydrocarbon chain after curing as a main chain preferably include a monomer having an ethylenically unsaturated group described below.

As the binder polymer having a saturated hydrocarbon chain as a main chain and having a crosslinked structure, a (co)polymer of monomers having two or more ethylenically unsaturated groups is preferable.

Examples of the monomer having two or more ethylenically unsaturated groups used in the curable resin compound for forming a binder layer 58 include esters of polyhydric alcohol with (meth)acrylic acid {for example, ethylene glycol di(meth)acrylate, butanediol di(meth)acrylate, hexanediol di(meth)acrylate, 1,4-cyclohexanediacrylate, pentaerythritol tetra(meth)acrylate, pentaerythritol tri(meth) acrylate, trimethylolpropane tri(meth)acrylate, trimethylolethane tri(meth)acrylate, dipentaerythritol tetra(meth)acrylate, dipentaerythritol penta(meth)acrylate, dipentaerithritol hexa(meth)acrylate, pentaerythritol hexa(meth)acrylate, 1,2,3-clohexane tetramethacrylate, polyurethane polyacrylate, and polyester polyacrylate}, vinylbenzene and derivatives thereof (for example, 1,4-divinylbenzene, 4-vinyl benzoic acid-2-acryloylethylester, and 1,4-divinyl cyclohexanone), vinylsulfones (for example, divinylsulfone), and (meth) acrylamides (for example, methylenebisacrylamide).

Commercially available multifunctional acrylate-based compounds having a(n) (meth)acryloyl group can be used. Examples of commercially available products KAYARAD DPHA and KAYARAD PET-30 manufactured by Nippon Kayaku Co., Ltd., and NK ESTER A-TMMT, NK ESTER A-TMPT, and the like manufactured by Shin-Nakamura Chemical Co., Ltd. From the viewpoint of suppressing curling by reducing cure shrinkage, it is preferable to increase a distance between the crosslinking points by adding ethylene oxide, propylene oxide or caprolactone and, for example, ethylene oxide-added trimethylolpropane triacrylate (for example, BISCOAT V#360 produced by Osaka Organic Chemical Industry Ltd.), glycerol propylene oxide-added triacrylate (for example, V#GPT produced by Osaka Organic Chemical Industry Ltd.) and caprolactone-added dipentaerythritol hexaacrylate (for example, DPCA-20 and DPCA-120 produced by Nippon Kayaku Co., Ltd.) are preferably used. It is also preferable to use two or more kinds of the monomers having two or more ethylenically unsaturated groups together.

The curable resin compound for forming the binder layer 58 may be a low molecular weight compound, polymer, or oligomer.

Examples of the curable resin compound in the present invention include a resin having two or more ethylenically unsaturated groups, for example, a polyester resin, a polyether resin, an acrylic resin, an epoxy resin, a urethane resin, an alkyd resin, a spiroacetal resin, a polybutadiene resin and a polythiol polyene resin each having a relatively low molecular weight and an oligomer or prepolymer of a polyfunctional compound, for example, a polyhydric alcohol. Two or more kinds of the compounds may be used in combination.

The content of the resin having two or more ethylenically unsaturated groups is preferably 10% to 100% by mass with respect to the curable resin compound which becomes a binder.

Polymerization of the compound having ethylenically unsaturated groups can be performed by irradiation with ionizing radiation or heating in the presence of a photo radical polymerization initiator or a thermal radical polymerization initiator.

Therefore, the binder layer 58 holding the particles 60 on the surface of the support layer 54 can be formed by preparing a curable composition (coating solution) containing the compound having ethylenically unsaturated groups, a photo radical polymerization initiator or thermal radical polymerization initiator, the particles 60, and, if necessary, a dispersing solvent a coating aid, other additives and the like, applying the curable composition on the support layer 54, and then curing the curable composition by a polymerization reaction due to irradiation with ionizing radiation or heating. It is also preferred to conduct together the ionizing radiation curing and the heat curing.

In this case, it is preferable to perform ionizing radiation curing and thermosetting in combination. As the photo polymerization initiator and thermal polymerization initiator, commercially available compounds can be used.

In the light guiding plate 52 of the display device 50, it is preferable that a difference in refractive index between the support layer 54 and the binder layer 58 is small.

Specifically, a difference in refractive index between the support layer 54 and the binder layer 58 is preferably 0.2 or less and more preferably 0.1 or less.

By setting a difference in refractive index between the support layer 54 and the binder layer 58 to 0.2 or less, light reflection at the interface between the support layer 54 and the binder layer 58 is prevented and more suitably light is reflected by the particles 60. Thus, the light emitted from the light guiding plate 52 can be obliquely emitted.

As described above, the binder layer 58 holds the particles 60 and is laminated and bonded to the support layer 54.

In the present invention, the particles 60 have light-transmitting properties. As the particles 60, as long as the convex portion formed by the particle has an inclined portion, particles of any shape such as spherical shape, a nearly spherical shape, a regular octahedral shape, a truncated regular octahedral shape, a regular tetrahedral shape, a truncated regular tetrahedral shape, and a flat plate-like shape may be used. However, a spherical shape or a nearly spherical shape is preferable. The particles 60 partially protrude from the binder layer 58 and are held in the binder layer 58.

Specific examples of the particles 60 include resin particles such as crosslinked polymethyl methacrylate particles, crosslinked methyl methacrylate-styrene copolymer particles, crosslinked polystyrene particles, crosslinked methyl methacrylate-methyl acrylate copolymer particles, crosslinked acrylate-styrene copolymer particles, melamine/formaldehyde resin particles and benzoguanamine/formaldehyde resin particles. Among them, crosslinked polystyrene particles, crosslinked polymethyl methacrylate particles, crosslinked methyl methacrylate-styrene copolymer particles, crosslinked acrylate-styrene copolymer particles, or the like are preferable.

Further, surface modified particles in which a compound containing a fluorine atom, a silicon atom, a carboxyl group, a hydroxy group, an amino group, a sulfonic acid group, a phosphoric acid group or the like is chemically connected to the surface of the resin particle, or particles in which a nano-sized inorganic fine particle of silica is connected to the surface of the resin particle can also be used.

As the particles 60, various particles commercially available as microbeads, resin particles, fine resin particles, and the like can be used.

In the present invention, the film thickness of the binder layer 58 with respect to the average particle diameter of the particles 60 is preferably 0.3 to 0.95, more preferably 0.4 to 0.9, and even more preferably 0.5 to 0.8 at a ratio "film thickness of binder layer 58/average particle diameter of particles 60". The film thickness of the binder layer 58 is the film thickness of the binder layer 58 at a position at which the particle 60 is not provided.

By setting the ratio "film thickness of binder layer 58/average particle diameter of particles 60" to 0.3 to 0.95, the particles 60 from the binder layer 58 protrude appropriately and light is more suitably reflected by the particles 60. Thus, the light emitted from the light guiding plate 52 can be obliquely emitted.

The average particle diameter of the particles 60 is preferably 2 to 12 μm, more preferably 2 to 10 μm, even more preferably 2 to 6 μm, and particularly preferably 3 to 6 μm. In the present invention, the average particle diameter refers to a primary particle diameter.

The average particle diameter of the particles 60 is not particularly limited but is preferably larger than the wavelength of light and a size for geometrical light refraction. In a case where the average particle diameter of the particles 60 is 2 μm or more, in the light guiding plate 52 having the rear surface 52a formed into an uneven shape by forming the convex portions on the rear surface 52a by the particles 60, the thickness of the binder layer 58 can be made sufficient and a sufficient strength can be obtained in the binder layer 58. In a case where the average particle diameter of the particles 60 is 12 μm or less, the sedimentation rate of the particles is decreased, the collision frequency between the particles is decreased during drying immediately after application and particle aggregation is suppressed. Thus, favorable oblique emission can be performed by suitably dispersing the particles 60.

Two or more kinds of particles 60 having different average particle diameters from each other may be used to adjust the uneven shape of the rear surface 52a.

As a method of measuring the average particle diameter of the particles 60, any measurement method can be suitably used as long as the method is a method of measuring particle diameter of the particle. Specifically, a method in which a particle size distribution of particles is measured by a coulter counter method to calculate an average particle diameter from a particle distribution obtained by converting the measured distribution into a particle number distribution, and a method in which particles are observed with a transmission electron microscope (magnification: 500,000 to 2,000,000 times), 100 particles are observed, and an average value thereof is taken as the average particle diameter may be used.

In the present invention, as the average particle diameter of the particles 60, a value obtained by a coulter counter method is used.

In the light guiding plate 52 of the display device 50, it is preferable that a difference in refractive index between the binder layer 58 and the support layer 54, and the particle 60 is small.

Specifically, a difference in refractive index between the binder layer 58 and the support layer 54, and the particle 60 is preferably 0.2 or less and more preferably 0.1 or less.

By setting a difference in refractive index between the binder layer 58 and the support layer 54, and the particles 60 to 0.2 or less, light reflection is prevented at the interface between the binder layer 58 or the support layer 54 and the particles 60 and more suitably, light is reflected by the particles 60. Thus, the light emitted from the light guiding plate 52 can be obliquely emitted.

By using two or more kinds of particles 60 having different refractive indexes, the refractive index relationship between the binder layer 58 and the support layer 54, and the particles 60 may be adjusted.

The refractive index of the particles 60 is measured in the following manner. Two kinds of solvents randomly selected from among methylene iodide, 1,2-dibromopropane, and n-hexane, and having different refractive indexes are mixed by changing a mixing ratio to obtain solvents different in refractive index. The particles 60 are dispersed in each of the solvents in an equivalent amount, turbidity is measured, and the refractive indexes of the solvents at the time when the turbidity becomes minimum is measured with Abbe's refractometer.

In the light guiding plate 52, the amount of the particles 60 may be appropriately set according to the particle diameter of the particles 60 or the like. Specifically, the amount of the particles 60 is preferably 3% to 20% by mass, more preferably 5% to 18% by mass, and even more preferably 7% to 15% by mass with respect to the total mass of the total solid content of the binder layer 58 and the particles 60.

The light guiding plate 52 is formed by bonding the surface on the opposite side of the binder layer 58 of the support layer 54 on which the binder layer 58 holding such particles 60 is laminated to the surface to the main body 52A by the bonding layer 62.

For the bonding layer 62, layers formed of various known materials can be used as long as the support layer 54 can be bonded to the main body 52A with a required adhesive strength. That is, the bonding layer 62 may be formed of an adhesive, a pressure sensitive adhesive, or a material having properties of an adhesive and an adhesive. Accordingly, as the bonding layer 62, a known bonding layer used in bonding of a sheet-like material in optical devices, optical elements, and the like, such as an optical clear adhesive (OCA), an optical clear double-sided tape, an optical transparent pressure sensitive adhesive sheet, and an ultraviolet curable resin, may be used.

Regarding the thickness of the bonding layer 62, the thickness at which the support layer 54 can be bonded to the main body 52A with a required adhesive strength may be appropriately set according to the material for forming the bonding layer 62. The thinner the bonding layer 62 is, the more preferable it is, as long as a required adhesive strength between the main body 52A and the support layer 54 can be obtained.

In the light guiding plate 52 of the display device 50, a difference in refractive index between the main body 52A and the bonding layer 62 is preferably 0.05 to 0.3 and more preferably 0.05 to 0.1.

By setting a difference in refractive index between the main body 52A and the bonding layer 62 to 0.05 to 0.3, light reflection at the interface between the main body 52A and the bonding layer 62 can be prevented.

Such a light guiding plate 52 may be manufactured by a known method.

For example, as described above, the curable composition containing the curable resin compound which mainly becomes the binder layer 58, such as a compound having an ethylenically unsaturated group, a polymerization initiator, and the particles 60 is prepared. To the curable composition, if necessary, a dispersing solvent, a coating aid, other additives and the like may be added.

The curable composition is applied to the support layer 54 and if necessary, after being dried, the curable resin compound is cured through a polymerization reaction by ionizing radiation or heating to prepare the support layer 54 on which the binder layer 58 holding the particles 60 on the surface is laminated.

The light guiding plate 52 can be prepared by bonding the support layer 54 to the main body 52A by the bonding layer 62.

In the preparation of the support layer 54 on which the binder layer 58 holding the particles 60 on the surface is laminated, methods described in JP2010-277080A can also be suitably used.

That is, a base layer dope obtained by dissolving the resin which becomes the support layer 54 in a solvent, the curable composition (surface layer dope) containing the curable resin compound, the polymerization initiator, and the particles 60 are prepared. Then, the support layer 54 on which the binder layer 58 holding the particles 60 on the surface is laminated may be prepared by simultaneously extruding the base layer dope and the surface layer dope on a support for casting such as a drum or band from separate slits, casting the base layer dope and the surface layer dope thereon in a laminated state, and stripping off the base layer dope and the surface layer dope from the support after being appropriately dried, and if necessary, further performing drying and curing.

In the display device 50 shown in FIGS. 11 and 12, the light guiding plate 52 is formed by bonding the support layer 54 on which the binder layer 58 holding the particles 60 on the surface is laminated to the main body 50A. However, the present invention is not limited thereto and the light guiding plate may be formed without using the support layer 54.

Figure 13:
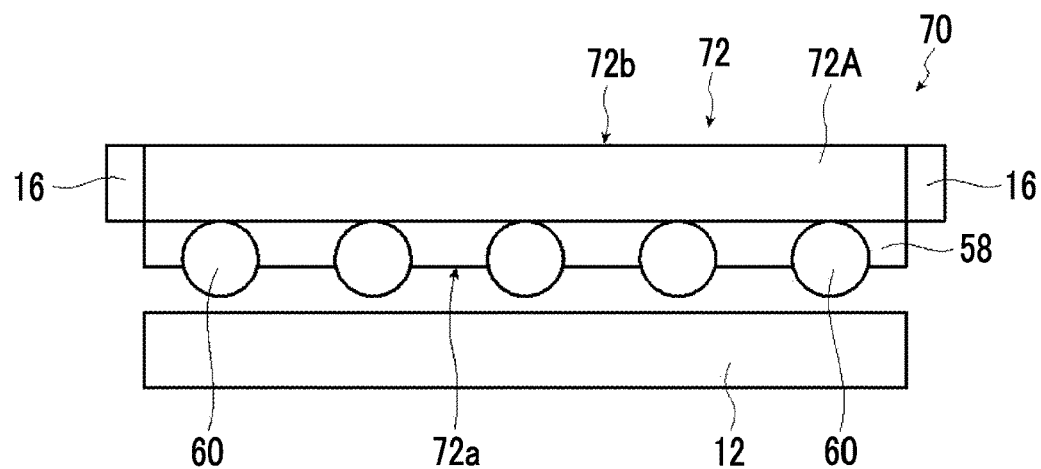
FIG. 13 is a schematic side view showing still another example of the display device of the present invention.

That is, as in a display device 70 conceptually shown in FIG. 13, the light guiding plate 72 may be formed by directly laminating and bonding the binder layer 58 holding the particles 60 to a principal surface of a main body 72A of the light guiding plate 72. a rear surface 72a and a visible surface 72b have the same configuration as the rear surface 14a and the visible surface 14b of the above-described light guiding plate 14.

Accordingly, in this case, for the same reasons described above, a difference in refractive index between the main body 72A, and the binder layer 58 and the particles 60 is preferably 0.1 or less and more preferably 0.05 or less. It is most preferable that there is no difference in refractive index between the main body 72A, and the binder layer 58 and the particles 60.

In the above example, an air layer is provided between the light guiding plate and the display element 12. By providing the air layer, the reflectivity in the light guiding plate is increased. Thus, oblique emission with a high light quantity can be performed and the visibility from the lateral direction in a case where the light source 16 is turned on can be lowered.

Regarding the thickness of the air layer, the thickness at which the light guiding plate and the display element 12 can be fully and completely separated from each other may be appropriately set according to the configuration of the display device. Here, basically, the thinner the air layer is, the more preferable it is, as long as this condition is satisfied.

Figure 14:
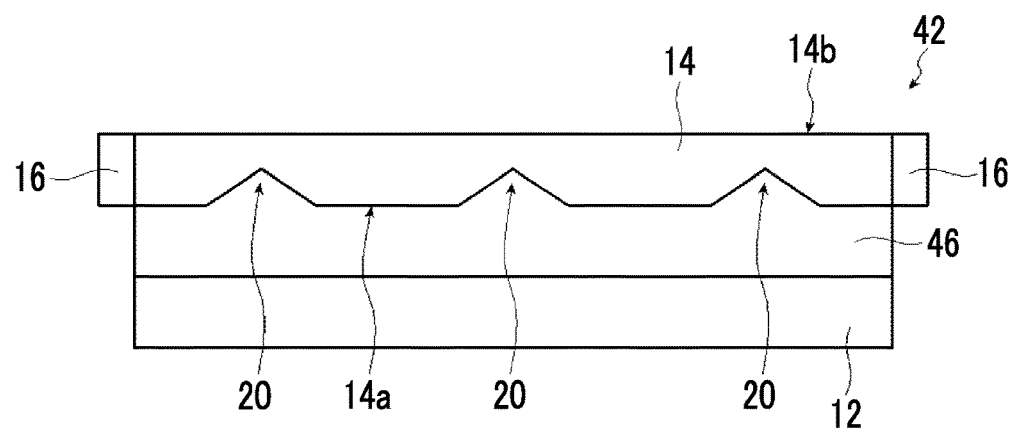
FIG. 14 is a schematic side view showing still another example of the display device of the present invention.

FIG. 14 shows still another example of the display device of the present invention. A display device 42 shown in FIG. 14 has a plurality of same members as in the above-described display device 10 shown in FIGS. 1 and 2 above, the same symbols are attached to the same members and different members are mainly described.

The display device 42 also has a display element 12, a light guiding plate 14 in which grooves 20 are formed on a rear surface 14a, and a light source 16.

As described above, the display device 10 has an air layer between the display element 12 and the light guiding plate 14.

In contrast, the display device 42 shown in FIG. 14 does not have an air layer between the display element 12 and the light guiding plate 14 and a bonding layer 46 is provided therebetween. The bonding layer 46 is provided for bonding the display element 12 and the light guiding plate 14 and has a difference in refractive index from the light guiding plate 14 of 0.05 or more.

Since the light guiding plate 14 has the grooves 20 on the rear surface 14a in the display device 42, as in the display device 10, 80% or more of the light emitted from the light guiding plate 14 can be can emitted (obliquely emitted) to a region at an angle of 30° or more with respect to the normal line N on the visible surface 30b by turning on the light source 16.

Thus, the display device 36 can switch a normal wide viewing angle display in a case where the light source 16 is turned off and a narrow viewing angle display in a case where the light source 16 is turned on.

Here, since the air layer is provided between the display element 12 and the light guiding plate 14 in the display device 10, due to a large difference in refractive index between the light guiding plate 14 and air, the light reflectivity in the light guiding plate 14 is increased. Thus, oblique emission with a high light quantity can be performed and the visibility from the lateral direction in a case where the light source 16 is turned on can be lowered.

Meanwhile, there are two interfaces having a large difference in refractive index by providing the air layer in the display device 10 having the air layer. Therefore, particularly, the light incident from the front, that is, in the direction of the normal line N is reflected at the interfaces and depending on the environment using the display device 10 or the like, interference caused by reflected light of external light occurs in a display image. As a result, the image looks having bleeding, the image becomes dark, reflected light of external light is reflected, or the like. Thus, the image quality of the display image is lower in some cases.

In contrast, the display device 42 shown in FIG. 14 does not have the air layer and has the bonding layer 46 having a difference in refractive index from the light guiding plate 14 of 0.05 or more and preferably 0.08 or more between the display element 12 and the light guiding plate 14.

Therefore, in the display device 42, there is no interface having a large difference in refractive index between the display element 12 and the light guiding plate 14, and reflection of external light at the interface is suppressed. Thus, it is possible to suppress lowering of the image quality of the display image caused by external light.

Since the display device 42 having the bonding layer 46 does not have the air layer, reflection in the light guiding plate 14 is reduced and thus the light component of the light to be emitted at a sufficient angle with respect to the normal line N is reduced. However, by setting difference in refractive index between the light guiding plate 14 and the bonding layer 46 to 0.05 or more, in a case where the light source 16 is turned on, 80% or more of the light emitted from the light guiding plate 14 can be can emitted to a region at a wide angle of 30° or more with respect to the normal line N on the visible surface 14b of the light guiding plate 14.

That is, in the display device of the present invention, in a case where a reduction in the visibility of a display at a narrow viewing angle in the lateral direction is considered as important, it is preferable to provide an air layer between the display element 12 and the light guiding plate 14, and in a case where the image quality is considered as important, it is preferable that the bonding layer 46 is provided between the display element 12 and the light guiding plate 14 and a difference in refractive index between the light guiding plate 14 and the bonding layer 46 is reduced as the image quality is considered as important.

In consideration of the above point, a difference in refractive index between the light guiding plate 14 and the bonding layer 46 is preferably 0.05 to 0.3 and more preferably 0.05 to 0.1.

Regarding the thickness of the bonding layer 46, the thickness at which the display element 12 and the light guiding plate 14 can be reliably bonded and the display element 12 and the light guiding plate 14 are not in contact with each other may be appropriately set according to the material for forming the bonding layer 46.

Basically, the thinner the bonding layer 46 is, the more preferable it is, as long as this condition is satisfied.

As the material for forming the bonding layer 46, as long as the material has sufficient transparency and a difference in refractive index between the light guiding plate 14 and the material is 0.05 or more, various materials can be used.

For example, an acrylic ester polymer can be preferably used. Examples thereof include materials described in paragraph [0035] of JP2013-203899A. In a case where such a general material is used, the refractive index of the bonding layer 46 can be appropriately adjusted to the value required for the condition of the present invention.

The display device 42 having such a bonding layer 46 may be prepared by, for example, a coating method.

That is, the light guiding plate 14 and the display element 12 are prepared and further, a composition which becomes the bonding layer 46 is prepared. Next, the composition which becomes the bonding layer 46 is applied to the light guiding plate 14 and/or the display element 12 and the composition is dried and/or cured, if necessary.

Then, a laminate of the light guiding plate 14, the bonding layer 46, and the display element 12 is prepared and if necessary, the bonding layer 46 is cured (crosslinked) to prepare the display device 42.

The bonding layer 46, the display element 12, and/or the light guiding plate 14 may be laminated by using the pressure sensitive adhesive force (adhesive force) of the bonding layer 46 or by using an OCA, a transparent pressure sensitive adhesive sheet, or the like. In this case, lamination with one side may be performed by using the pressure sensitive adhesive force of the bonding layer 46 and lamination with the other side may be performed by using an OCA or the like.

The display device 42 having the bonding layer 46, if necessary, a dielectric multilayer film may be provided between the bonding layer 46 and the display element 12.

By providing the dielectric multilayer film between the bonding layer 46 and the display element 12, the light mainly emitted from the light source 16 and obliquely emitted from the light guiding plate 14 can be reflected on the dielectric multilayer film and returned to the light guiding plate 14. Thus, the light passing through the light guiding plate 14 straightly (in the normal line N direction) that is mainly caused by external light can be transmitted.

Therefore, by providing the dielectric multilayer film between the bonding layer 46 and the display element 12, more suitably, lowering of image quality caused by external light can be prevented and in a case of a narrow viewing angle, the visibility from the lateral direction can be lowered.

As the dielectric multilayer film, various known dielectric multilayer films can be used and the dielectric multilayer film may be formed by a known method.

The configuration in which the bonding layer 46 is provided or the dielectric multilayer film is further provided can be applied to a display device in which the rear surface of the light guiding plate is formed into an uneven shape by providing the convex portions on the rear surface of the light guiding plate like the display device 28 as shown in FIGS. 6 and 7, and a display device in which the rear surface of the light guiding plate is formed into an uneven shape by using the particles 60 as shown in FIGS. 11 to 13, in addition to a display device in which the rear surface of the light guiding plate is formed into an uneven shape by providing concave portions on the rear surface of the light guiding plate like the display device 42 having the grooves 20 formed on the rear surface 14a of the light guiding plate 14.

Figure 15:
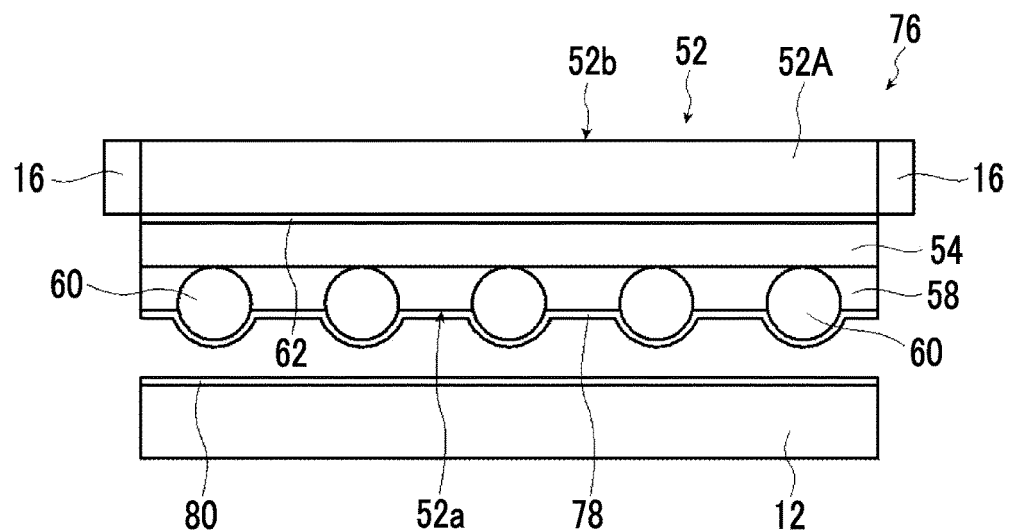
FIG. 15 is a schematic side view showing still another example of the display device of the present invention.

FIG. 15 shows still another example of the display device of the present invention. A display device 76 shown in FIG. 15 has a plurality of same members as in the above-described display device 50 shown in FIGS. 11 and 12, the same symbols are attached to the same members and different members are mainly described.

The display device 76 shown in FIG. 15 has a configuration in which an antireflection layer 78 is provided on the surface of the rear surface 52a of the light guiding plate 52 in the display device 50 shown in FIG. 12 or the like and further an antireflection layer 80 is provided on an image display surface of the display element 12.

By providing the antireflection layer 78 on the rear surface of the light guiding plate 52 and/or the antireflection layer on the image display surface of the display element 12, as in the above-described display device 42 shown in FIG. 14, reflection of external light at the interface is suppressed. Thus, it is possible to suppress lowering of the image quality of the display image caused by external light.

The antireflection layers 78 and 80 are not particularly limited and for example, all known antireflection films such as an antireflection film formed by laminating a layer of high refractive index and a layer of low refractive index can be used. From the viewpoint that the uneven shape formed of the convex portions by the particles 60 are not embedded or the like, as the antireflection layer 78 on the rear surface 52a of the light guiding plate 52, an antireflection film of an inorganic substance formed by a vapor deposition method such as sputtering is suitably used.

The film thickness of the antireflection film may be appropriately set according to the material for forming the antireflection film, antireflection performance required for the antireflection film, and the like.

The display device 76 shown in FIG. 15 has the antireflection layer 78 on the rear surface 52a of the light guiding plate 52 and the antireflection layer 80 on the image display surface of the display element 12, but the present invention is not limited thereto.

That is, the display device of the present invention may have only the antireflection layer 78 on the rear surface 52a of the light guiding plate 52 or may have only the antireflection layer 80 on the image display surface of the display element 12.

The configuration having such antireflection layers can also be applied to a display device in which the rear surface 14a of the light guiding plate is formed in an uneven shape by providing the convex portions such as the grooves 20 like the display device 42 shown in FIGS. 1 and 2, and the display device in which the rear surface 30*a* of the light guiding plate 30 is formed in an uneven shape by providing the convex portions 32 on the rear surface 30*a* like the display device 28 shown in FIGS. 6 and 7, in addition to the display device in which the rear surface 52*a* of the light guiding plate 52 is formed in an uneven shape by forming the concave portions by using the particles 60 like the display device 50 shown in FIGS. 11 and 12 (FIG. 13).

In the display device of the present invention, in order to display an image with high image quality, the haze of the light guiding plate is preferably 30% or less and more preferably 10% or less.

In the display device of the present invention, the light guiding plate may be used as a touch panel by forming a transparent electrode or the like inside the light guiding plate. Alternatively, in the display device of the present invention, a touch panel may be used as the light guiding plate. That is, the display device of the present invention may have a function of a touch panel.

In a case of using the display device of the present invention, the light guiding plate may be used as a front surface plate of a device such as a tablet PC. In other words, the light guiding plate of the display device of the present invention may be formed by using a material that can be used for a front surface plate of a device such as a tablet PC.

In the above examples, unevenness is formed on the rear surface of the light guiding plate. However, the present invention is not limited thereto and the visible surface of the light guiding plate may be formed into the same uneven shape. Alternatively, both surfaces of the principal surface of the light guiding plate may be formed into the same uneven shape. From the viewpoint of suppressing visual recognition of the grooves and convex portions constituting the uneven shape by reflection of external light, it is preferable to form unevenness on the rear surface of the light guiding plate.

The light emitted from the light guiding plate may not be homogeneous in the plane or specific information (for example, pattern display of information such as advertisements and signage) may be emitted.

Although the display device of the present invention has been described above, the present invention is not limited to the above-described examples and various improvements and modifications can be of course made within a range not departing from the scope of the present invention.

EXAMPLES

Hereinafter, the characteristic features of the present invention will be described in more detail based on examples. Materials, reagents, amounts used, amounts of substances, proportions, treatment contents, treatment procedures and the like described in the following examples can be appropriately changed without departing from the spirit and scope of the present invention. Accordingly, the scope of the invention should not be construed as being restrictively interpreted by the examples shown below.

Example 1

A flat plate (SUMI-HOLIDAY, manufactured by Hikari Co., Ltd.) formed of polymethyl methacrylate (PMMA) and having a thickness of 2 mm and a size of 100×100 mm was prepared. The refractive index of the flat plate is 1.48.

On the other hand, a mold (formed of nickel) having a plurality of long convex portions having an isosceles-triangular cross-sectional shape having an apex angle of 160° are separated from each other in a direction orthogonal to a longitudinal direction was prepared. The cross-sectional shape of the convex portion is a cross-sectional shape of the convex portion in the direction orthogonal to the longitudinal direction.

The mold was pressed to the PMMA flat plate formed for 30 minutes to transfer the shape to the flat plate. The shape was transferred in a state in which the longitudinal direction of the convex portion of the mold coincided with a transverse direction of the flat plate.

Thus, a light guiding plate as shown in FIGS. 1 and 2 in which a plurality of long grooves having an isosceles-triangular cross-sectional shape having an apex angle of 160° (triangular grooves) were on one surface of the PMMA flat plate formed in a direction orthogonal to the longitudinal direction was prepared. The grooves were formed in the entire region in the transverse direction of the light guiding plate in a state in which the longitudinal direction coincided with the transverse direction of the light guiding plate.

10 grooves were randomly selected from the prepared light guiding plate and the shapes thereof were observed with a laser microscope (manufactured by KEYENCE CORPORATION). As a result, the size s of the grooves was 20 μm, the interval p between the grooves was 100 μm, and the depth of the grooves was 57 μm (all of which are average values).

Further, randomly selected 5 places were observed with a laser microscope (manufactured by KEYENCE CORPORATION) and the area ratio was measured in a region of a size of 1×1 mm. As a result, the area ratio thereof was 17% (average value).

LED arrays were mounted on the end surfaces of the light guiding plate in the transverse direction as a light source.

An iPad Air (registered trademark) manufactured by Apple Inc. was disassembled to extract a liquid crystal display (LCD) panel and was used as a display element.

The light guiding plate was mounted on the display element such that the display surface faced the surface of the light guiding plate on which the grooves were formed. The display element was disposed such that one direction of the arrangement direction of pixels coincided with the longitudinal direction of the groove of the light guiding plate. A 1 mm air layer was provided between the light guiding plate and the display element.

Thus, the display device as shown in FIGS. 1 and 2 was prepared.

In a case where the light sources (LED arrays) were turned on, the proportion of light emitted to a region at an angle of 30° or more with respect to the normal line N on the visible surface 14*b* was measured using a luminance meter (BM-5A, manufactured by TOPCON CORPORATION).

In the following description, the proportion of light emitted to a region at an angle of 30° or more with respect to the normal line N on the visible surface 14*b* is referred to as a "proportion of obliquely emitted light".

As a result, the proportion of obliquely emitted light was 95%.

Example 2

A light guiding plate was prepared and then a display device was prepared in the same manner as in Example 1 except that the apex angle of the isosceles-triangular convex portions of the mold was 150°. Accordingly, the apex angle of the long isosceles-triangular grooves of the light guiding plate of the display device is 150°.

As a result of measuring the prepared light guiding plate as in Example 1, the size s of the grooves was 20 µm, the interval p between the grooves was 100 µm, the depth of the grooves was 37 µm, and the area ratio thereof was 17% (all average values).

The proportion of obliquely emitted light was measured in the same manner as in Example 1. As a result, the proportion of obliquely emitted light was 90%.

Example 3

A light guiding plate was prepared and then a display device was prepared in the same manner as in Example 1 except that the apex angle of the isosceles-triangular convex portions of the mold was 120°. Accordingly, the apex angle of the long isosceles-triangular grooves of the light guiding plate of the display device is 120°.

As a result of measuring the prepared light guiding plate as in Example 1, the size s of the grooves was 20 µm, the interval p between the grooves was 100 µm, the depth of the grooves was 17 µm, and the area ratio thereof was 17% (all average values).

The proportion of obliquely emitted light was measured in the same manner as in Example 1. As a result, the proportion of obliquely emitted light was 85%.

Example 4

A light guiding plate was prepared and then a display device was prepared in the same manner as in Example 1 except that the apex angle of the isosceles-triangular convex portions of the mold was 100°. Accordingly, the apex angle of the long isosceles-triangular grooves of the light guiding plate of the display device is 100°.

As a result of measuring the prepared light guiding plate as in Example 1, the size s of the grooves was 20 µm, the interval p between the grooves was 100 µm, the depth of the grooves was 12 µm, and the area ratio thereof was 17% (all average values).

The proportion of obliquely emitted light was measured in the same manner as in Example 1. As a result, the proportion of obliquely emitted light was 80%.

Comparative Example 1

Only the display element used in Example 1 was used as a display device.

Comparative Example 2

A light guiding plate was prepared and then a display device was prepared in the same manner as in Example 1 except that the apex angle of the isosceles-triangular convex portions of the mold was 90°. Accordingly, the apex angle of the long isosceles-triangular grooves of the light guiding plate of the display device is 90°.

As a result of measuring the prepared light guiding plate as in Example 1, the size s of the grooves was 20 µm, the interval p between the grooves was 100 µm, the depth of the grooves was 10 µm, and the area ratio thereof was 17% (all average values).

The proportion of obliquely emitted light was measured in the same manner as in Example 1. As a result, the proportion of obliquely emitted light was 75%.

Example 5

<Formation of Underlayer>

Components shown below were stirred and dissolved in a vessel kept at 25° C. to prepare an underlayer solution.

<<Underlayer Solution (Parts by Mass)>>

Propylene glycol monomethyl ether acetate 67.8

Dipentaerythritol hexaacrylate (KAYARAD DPHA, manufactured by Nippon Kayaku Co., Ltd.) 5.0

Surfactant (MEGAFACE RS-90, manufactured by DIC Corporation) 26.7

Photopolymerization initiator (IRGACURE 819, manufactured by BASF SE) 0.5

One surface of the PMMA flat plate used in Example 1 was subjected to corona treatment.

The prepared underlayer solution was applied to the corona-treated surface of the flat plate using a bar coater in a coating amount of 3 mL (liter)/m$^2$. Then, heating was performed until the film surface temperature reached 90° C., and after the film was dried for 120 seconds, a crosslinking reaction was carried out by emitting ultraviolet light of 700 mJ/cm$^2$ to the film from an ultraviolet emission device under nitrogen purge in an oxygen concentration of 100 ppm or less, thereby forming an underlayer.

<Formation of Convex Portions>

Components shown below were stirred and dissolved in a vessel kept at 25° C. to prepare a convex portion forming composition (cholesteric liquid crystal composition).

<<Convex Portion Forming Composition (parts by mass)>>

Methoxyethyl acrylate 145.0

Mixture of rod-like liquid crystal compounds shown below 100.0

Photopolymerization initiator (IRGACURE 819, manufactured by BASF SE) 10.0

Chiral agent A having the following structure 3.97

Surfactant shown below 0.08

Rod-Like Liquid Crystal Compounds

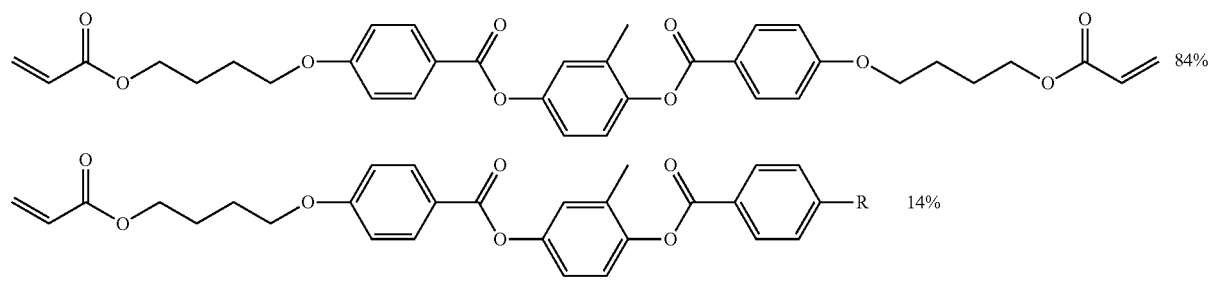

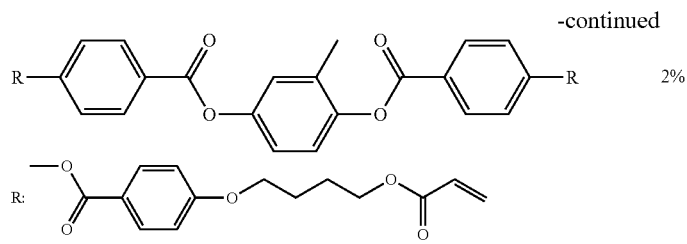

2%

The numerical values are expressed as % by mass. R represents a group bonded with oxygen.

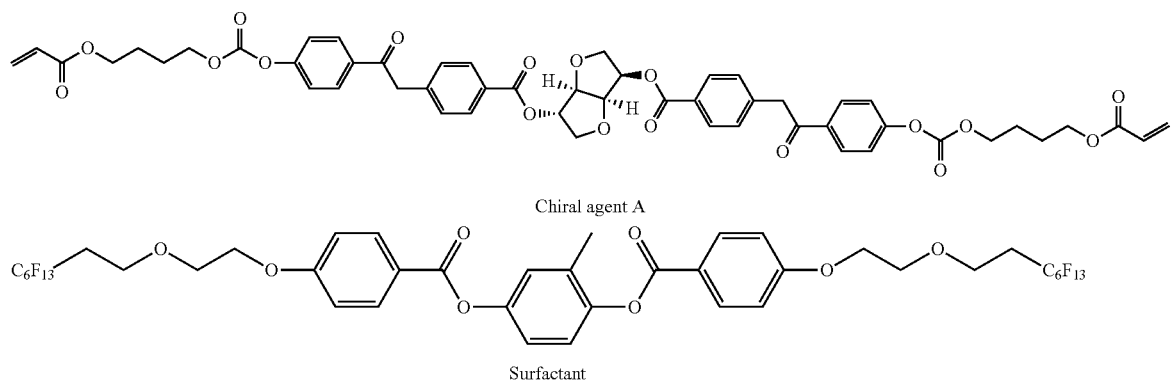

Chiral agent A

Surfactant

The (cholesteric liquid crystal) composition is a material for forming convex portions reflecting right circularly polarized light having a center wavelength of 800 nm. The material does not reflect visible light in a front direction. However, since light to be incident on the cholesteric layer is oblique with respect to light obliquely propagating in the light guiding plate, the reflection wavelength is shift to short wave side, and the material reflects red light near 650 nm. Thus, the effect as described in Example 6 which will be described later is obtained.

In a case where the temperature at the time of curing is increased to 130° C., the liquid crystal layer is changed to an isotropic layer and an isotropic material not causing cholesteric reflection is obtained. Thus, as described later, anisotropy disappears.

The convex portion forming composition was jetted to the entire surface of the PMMA flat plate on which the underlayer plate was formed by an ink jet printer (DMP-2831, manufactured by FUJIFILM Dimatix, Inc.) and dried at 95° C. for 30 seconds. Then, the composition was cured (UV-cured) by emitting ultraviolet light of 500 mJ/cm$^2$ to the composition from an ultraviolet emission device in an environment at 130° C., and thus convex portions were formed.

Thus, as shown in FIGS. 6 and 7, a light guiding plate having a large number of convex portions was prepared.

The material for forming the convex portions is a liquid crystal but the liquid crystal is changed to an isotropic phase by UV curing at 130° C. and anisotropy disappears.

10 convex portions were randomly selected and the prepared light guiding plate was measured in the same manner as in Example 1. As a result, the size s (diameter) of the convex portions was 23 μm, the interval p between the convex portions was 100 μm, and the height of the convex portions was 10 μm. The internal angle γ of the spherical segment-shaped convex portion was 50°. The area ratio was measured in the same manner as in Example 1 and the area ratio was 6.5%.

The refractive index of the material for forming the convex portions was measured using Abbe's refractometer (NAR-4T, manufactured by Atago Inc.) and a sodium lamp (λ=589 nm) as a light source. The refractive index of the convex portions was 1.58.

A display device was prepared in the same manner as in Example 1 except that this light guiding plate was used.

The proportion of obliquely emitted light was measured in the same manner as in Example 1. As a result, the proportion of obliquely emitted light was 85%.

Example 6

<Formation of Convex Portions>

As in Example 5, the PMMA flat plate was subjected to corona treatment to form an underlayer. The convex portion forming composition was jetted to the entire surface of the flat plate and dried at 95° C. for 30 seconds.

Then, the composition was cured (UV-cured) by emitting ultraviolet light of 500 mJ/cm$^2$ to the composition from an ultraviolet emission device in an environment of room temperature to form convex portions.

Since the convex portions are cured in room temperature, as described in Example 5, the convex portions respectively selectively reflecting light of infrared wavelength of light in the front direction and light of red wavelength of light obliquely propagating in light guiding plate are formed.

The convex portion is formed by using a liquid crystal having birefringence. As a result of measuring the refractive index as in Example 6, the refractive index of the liquid crystal was 1.65 in at the slow axis azimuth and 1.5 at the fast axis azimuth.

<Formation of Coating Layer>
Components shown below were stirred and dissolved in a vessel kept at 25° C. to prepare a coating layer solution.

<<Coating Layer Solution (Parts by Mass)>>
Acetone 100.0
KAYARAD DPCA-30 (manufactured by Nippon Kayaku Co., Ltd.) 30.0
Acrylate monomer (EA-200, manufactured by Osaka Gas Chemicals Co., Ltd.) 70.0
Photopolymerization initiator (IRGACURE 819, manufactured by BASF SE) 3.0

The coating layer solution was applied to the underlayer having the convex portions formed thereon in a coating amount of 40 mL/m$^2$ using a bar coater. Then, heating was performed until the film surface temperature reached 50° C., and after the film was dried for 60 seconds, a crosslinking reaction was carried out by emitting ultraviolet light of 500 mJ/cm$^2$ to the film from an ultraviolet emission device to form a coating layer. As shown in FIG. 9, a light guiding plate was obtained. The thickness of the coating layer was 18 μm.

The refractive index of the coating layer was measured in the same manner as in Example 5 and was 1.58. As described above, since the average refractive index of the convex portions is 1.58 and the refractive index of the coating layer is 1.58, a difference in refractive index between the convex portions and the coating layer is suppressed to be small.

A display device was prepared in the same manner as in Example 1 except that the light guiding plate was used.

The proportion of obliquely emitted light was measured in the same manner as in Example 1. As a result, the proportion of obliquely emitted light was 85%.

Example 7

A display device was prepared in the same manner as in Example 1 except that the display element was changed from the LCD to an organic EL display (organic light emitting diode (OLED)) panel. An organic EL display panel was extracted from GALAXY S6 manufactured by Samsung Electronics Co., Ltd and was used.

Accordingly, the proportion of obliquely emitted light of the display device was 85%.

[Evaluation]
Regarding each display device prepared, white and black square patterns were alternately displayed by the display element and in a state in which the light source was turned off (OFF) and a state in which the light source was turned on (ON), the contrast (contrast ratio) was measured from the front (normal line N direction) and a 45° direction with respect to the normal line N and was evaluated.

The measurement of the contrast was performed using a luminance meter (for example, BM-5A manufactured by TOPCON CORPORATION).

Regarding Examples 1 and 3, the contrast was also measured from a 60° direction with respect to the normal line N and was evaluated.

The evaluation is as follows.
A: The contrast was more than 100.
B: The contrast was more than 10 and 100 or less.
C: The contrast was more than 5 and 10 or less.
D: The contrast was 5 or less.
The results are shown in the following table.

Example 8

Components shown below were mixed, propylene glycol monomethyl ether acetate was added such that the amount of propylene glycol monomethyl ether acetate was 30% by mass in the entire solvent and then diluted with methyl ethyl ketone, and finally, the concentration of solid contents was adjusted to be 5% by mass, thereby preparing a solution.

The prepared solution was poured into a glass separable flask equipped with a stirrer, stirred at room temperature for 1 hour, and then filtered through a polypropylene depth filter having a pore size of 0.5 μm. Thus, a bonding layer forming composition was prepared.

<Components of Bonding Layer Forming Composition (% by Mass)>
Mixture of dipentaerythritol pentaacrylate and dipentaerythritol hexaacrylate (manufactured by Nippon Kayaku Co., Ltd.) 48.5
Dispersion liquid A shown below 45
Photopolymerization initiator (IRGACURE 127, manufactured by BASF SE) 3
Antifouling agent (reactive silicone, manufactured by Shin-Etsu Chemical Co., Ltd.) 3.5

<<Dispersion Liquid A>>
A hollow silica particle dispersion liquid (concentration of solid contents: 18.2% by mass) having an average particle diameter of 60 nm, a shell thickness of 10 nm, and a refractive index of silica particles of 1.31 was prepared by using the same method as in the preparation of a dispersion liquid A-1 described in JP2007-298974A and adjusting conditions.

15 parts by mass of acryloyloxypropyltrimethoxysilane and 1.5 parts by mass of diisopropoxy aluminum ethyl acetate were added and mixed with 500 parts by mass of the hollow silica particle dispersion liquid and then 9 parts by mass of ion exchange water was added. After a reaction was allowed to proceed at 60° C. for 8 hours, the reaction mixture was cooled to room temperature and 1.8 parts by mass of acetylacetone was added thereto. While adding methyl isobutyl ketone to the obtained liquid dispersion to keep the total solution amount almost constant, the solvent was replaced by reduced-pressure distillation. Finally, the concentration of solid contents was adjusted to 20%, to prepare a dispersion liquid A.

The same light guiding plate as in Example 3 was prepared.

The bonding layer forming composition was applied to the surface of the light guiding plate on which the grooves were formed with a bar coater and dried at 100° C. After drying, the composition was cured by emission of ultraviolet light of 1000 mJ/cm$^2$ and thus a bonding layer was formed. The thickness of the bonding layer was 2 μm.

The refractive index of the bonding layer was measured in the same manner as in Example 5 and the refractive index of the bonding layer was 1.4. As described above, since the refractive index of the light guiding plate is 1.48, a difference in refractive index between the bonding layer and the light guiding plate is 0.08.

Next, the same display element as in Example 1 was laminated thereon using a pressure sensitive adhesive (SK DYNE 2057, manufactured by Soken Chemical & Engineering Co., Ltd.) in a state in which the image display surface faced the bonding layer to prepare a display device. The display element was disposed such that one direction of the arrangement direction of the pixels coincided with the longitudinal direction of the groove of the light guiding plate.

In the display device, the proportion of obliquely emitted light was measured in the same manner as in Example 1. As a result, the proportion of obliquely emitted light was 80%.

Example 9

Components shown below were mixed and filtered through a polypropylene filter having a pore size of 30 μm to prepare a curable composition.

<Curable Composition (Parts by Mass)>

| | |
|---|---|
| KAYARAD PET-30 (manufactured by Nippon Kayaku Co., Ltd.) | 27.9 |
| BISCOAT #360 (manufactured by Osaka Organic Chemical Industry, Ltd.) | 16.7 |
| Cellulose acetate butyrate (manufactured by Eastman Chemical Company) | 1.0 |
| Photopolymerization initiator (IRGACURE 907, manufactured by BASF SE) | 0.5 |
| Photopolymerization initiator (IRGACURE 819, manufactured by BASF SE) | 1.9 |
| Dispersion liquid of 6 μm crosslinked acryl-styrene particles (30% by mass) | 22.3 |
| Dispersant (Disperbyk-2000, manufactured by BYK) | 2.1 |
| Compound (SP-13) shown below | 0.1 |
| Methyl isobutyl ketone (MIBK) | 6.0 |
| Methyl ethyl ketone (MEK) | 23.0 |

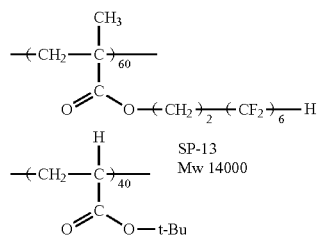

The refractive index of the crosslinked acryl-styrene particles was measured in the same manner as in Example 5 and the refractive index of the particles was 1.52.

The prepared curable composition was applied to a cellulose triacetate film (FUJITAC, manufactured by Fujifilm Corporation, thickness: 40 μm, refractive index: 1.48) having a surface subjected to saponification treatment by a die coating method under a condition of a conveying speed of 30 m/min.

The application of the curable composition by a die coating method was performed using a slot die having an upstream side lip land length of 0.5 mm, a downstream side lip land length of 50 μm, a length of an opening of the slot in a web conveying direction of 150 μm, and a slot length of 50 mm, and described in Example 1 of JP2006-122889A.

The applied curable composition was dried at 60° for 150 seconds. Then, the curable composition was further irradiated with ultraviolet light with an illuminance of 400 mW/cm² and an irradiation level of 150 mJ/cm² using a 160 W/cm air-cooling metal halide lamp (manufactured by Eye Graphic Co., Ltd.) under nitrogen purge in an oxygen concentration of about 0.1 vol % and cured and wound.

Thus, a film was prepared by forming a binder layer holding the particles on the surface of the support layer. The coating amount of the curable composition was adjusted such that the film thickness of the binder layer (average film thickness after curing) was 3.2 μm. Accordingly, the particles (particle diameter: 6 μm) protrude from the binder layer.

The refractive index of the binder layer was measured in the same manner as in Example 5 and the refractive index of the binder layer was 1.52.

The same flat plate formed of polymethyl methacrylate as in Example 1 was prepared.

The surface of the prepared film not having the binder layer was bonded to the flat plate with a pressure sensitive adhesive (SK DYNE 2057, manufactured by Soken Chemical & Engineering Co., Ltd.). Thus, a light guiding plate having an uneven shape of convex portions formed by the particles formed on the rear surface was prepared.

A display device was prepared in the same manner as in Example 1 except that the light guiding plate was used.

The proportion of obliquely emitted light was measured in the same manner as in Example 1. As a result, the proportion of obliquely emitted light was 85%.

Example 10

Referring to a method of preparing a light diffusing material 5 in examples of JP2010-277080A, a film was prepared by forming a binder holding particles on the surface of the support layer.

The solid components of the base layer dope are 100 parts by mass of cellulose triacetate, 8 parts by mass of triphenyl phosphate, 4 parts by mass of biphenyl diphenyl phosphate, and 2 parts by mass of an ultraviolet absorbent.

The solid components of the surface layer dope are 100 parts by mass of cellulose triacetate, 8 parts by mass of triphenyl phosphate, 4 parts by mass of biphenyl diphenyl phosphate, 2 parts by mass of an ultraviolet absorbent, and 15 parts by mass of particles. The particles added to the surface layer dope are MX-675 (crosslinked polymethyl methacrylate spherical particles, average particle diameter: 6.0 μm, manufactured by Soken Chemical & Engineering Co., Ltd.).

Both dopes were prepared such that the concentration of solid contents of the base layer dope was 23% by mass and the concentration of solid contents of the surface layer dope was 18.5% by mass by using a mixed solvent of methylene chloride:methanol at a mass ratio of 90:10.

A film was prepared by simultaneously casting the base layer dope and the surface layer dope and forming the binder holding the particles on the surface of the support layer.

Specifically, both dopes were laminated and cast using a casting device was used such that the base layer dope was disposed on a drum side cooled to −10° C. and both dopes were laminated and cast, and cooled for gelation while evaporating the solvent. A web was then stripped off. The web was dried by hot air at 100° C. until the residual solvent amount reached 10% by mass, and then dried by hot air at 140° C. for 10 minutes. The binder holding the particles was formed on the surface of the support layer to prepare a film.

The same flat plate formed of polymethyl methacrylate as in Example 1 was prepared.

The surface of the prepared film not having the binder layer was bonded to the flat plate with a pressure sensitive adhesive (SK DYNE 2057, manufactured by Soken Chemical & Engineering Co., Ltd.). Thus, a light guiding plate having an uneven shape of convex portions formed by the particles formed on the rear surface was prepared.

A display device was prepared in the same manner as in Example 1 except that the light guiding plate was used.

The proportion of obliquely emitted light was measured in the same manner as in Example 1. As a result, the proportion of obliquely emitted light was 85%.

Example 11

A display device was prepared in the same manner as in Example 9 except that a film was formed on the image display surface of the display element by reactive sputtering, and an antireflection layer including an adhesion layer, a layer of high refractive index a, a layer of high refractive index b, and a layer of low refractive index shown below was formed.

(1) Adhesion Layer; $SiO_x$
Sputtering target: B doped polycrystalline Si
Sputtering gas: Ar
Reactive gas: $O_2$
Reactive gas flow rate ratio: 10%
Input power: 100 W
Pressure at film formation: 0.13 Pa (2) Layer of High Refractive Index a: $SnO_2$
Sputtering target: metal Sn
Sputtering gas: Ar
Reactive gas: $CO_2$
Reactive gas flow rate ratio: 85%
Input power: 3 kW
Pressure at film formation: 0.6 Pa (3) Layer of High Refractive Index b: $Nb_2O_5$
Sputtering target: metal Nb
Sputtering gas: Ar
Reactive gas: $CO_2$
Reactive gas flow rate ratio: 10%
Input power: 500 W
Pressure at film formation: 0.6 Pa (4) Layer of low refractive index: $SiO_2$
Sputtering target: B doped polycrystalline Si
Sputtering gas: Ar
Reactive gas: $CO_2$
Reactive gas flow rate ratio: 10%
Input power: 100 W
Pressure at film formation: 0.3 Pa The adhesiveness between the image display surface and the formed antireflection film (adhesion layer, layer of high refractive index a, layer of high refractive index b, and layer of low refractive index) was good.

The proportion of obliquely emitted light was measured in the same manner as in Example 1. As a result, the proportion of obliquely emitted light was 85%.

Example 12

A display device was prepared in the same manner as in Example 9 except that the same antireflection film as in Example 11 was formed on the surface of the light guiding plate on which unevenness was formed.

The adhesiveness between the image display surface and the formed antireflection film (adhesion layer, layer of high refractive index a, layer of high refractive index b, and layer of low refractive index) was good.

The proportion of obliquely emitted light was measured in the same manner as in Example 1. As a result, the proportion of obliquely emitted light was 85%.

Example 13

A display device was prepared in the same manner as in Example 9 except that the same antireflection film as in Example 11 was formed on the image display surface of the display element and the surface of the light guiding plate on which unevenness was formed.

The adhesiveness between the image display surface and the formed antireflection film (adhesion layer, layer of high refractive index a, layer of high refractive index b, and layer of low refractive index) was good.

The proportion of obliquely emitted light was measured in the same manner as in Example 1. As a result, the proportion of obliquely emitted light was 85%.

[Evaluation]

Regarding each display device prepared, the contrast was measured and evaluated in the same manner as in Example 1.

Further, visual observation was performed under the condition that the light from the light source (halogen lamp) was made incident at an angle of 30° with respect to the normal line of the light guiding plate and was received by the front surface of the light guiding plate and then sensory evaluation on reflected glare of reflected light under external light was performed.

The evaluation is as follows.
A: Almost no reflected glare is observed.
B: Reflected glare is observed but ignorable.
C: Reflected glare is slightly disturbing.
D: Reflected glare is considerably disturbing.

The evaluation of reflected glare of reflected light was performed on Example 3.

The results are collectively shown in the table.

TABLE 1

| | | | | Comparative Example 1 | Example 1 | Example 2 | Example 3 | Example 4 | Comparative Example 2 | Example 5 | Example 6 |
|---|---|---|---|---|---|---|---|---|---|---|---|
| Structure | Light guiding plate | Unevenness shape | Triangle (angle) | — | Formed (160°) | Formed (150°) | Formed (120°) | Formed (100°) | Formed (90°) | — | — |
| | | | Sphericcal segment | | — | — | — | — | — | Formed | Formed (aligned) |
| | | | Particle | | — | — | — | — | — | — | — |
| | | Coating layer | | | — | — | — | — | — | — | Formed |
| | Bonding layer | | | | — | — | — | — | — | — | — |
| | Display element | | | LCD | LCD | LCD | LCD | LCD | LCD | LCD | LCD |
| | Antireflection layer | | Display element | — | — | — | — | — | — | — | — |
| | | | Light guiding plate | — | — | — | — | — | — | — | — |
| Proportion of obliquely emitted light [%] | | | | — | 95 | 90 | 85 | 80 | 75 | 85 | 85 |
| Evaluation | Contrast | Front | OFF | Preferable result | | | | | A | | |
| | | | | Measurement result | A | A | A | A | A | A | A | A |

TABLE 1-continued

|  |  |  |  |  |  |  |  |  |  |
|---|---|---|---|---|---|---|---|---|---|
|  | ON |  | Preferable result |  |  |  | A |  |  |
|  |  |  | Measurement result | — | A | A | A | C | D | A | A |
| 45° | OFF |  | Preferable result |  |  |  | A |  |  |
|  |  |  | Measurement result | A | A | A | A | A | A | A | A |
|  | ON |  | Preferable result |  |  |  | D |  |  |
|  |  |  | Measurement result | — | B | C | D | D | D | D | D |
| 60° | OFF |  | Preferable result |  |  |  | A |  |  |
|  |  |  | Measurement result | — | A | — | A | — | — | — | — |
|  | ON |  | Preferable result |  |  |  | D |  |  |
|  |  |  | Measurement result | — | D | — | D | — | — | — | — |
| Reflected glare of reflected light under external light |  |  |  | — | — | — | B | — | — | — | — |

|  |  |  |  | Example 7 | Example 8 | Example 9 | Example 10 | Example 11 | Example 12 | Example 13 |
|---|---|---|---|---|---|---|---|---|---|---|
| Structure | Light guiding plate | Unevenness shape | Triangle (angle) | Formed (120°) | Formed (120°) | — | — | — | — | — |
|  |  |  | Sphericcal segment | — | — | — | — | — | — | — |
|  |  |  | Particle | — | — | Formed | Formed | Formed | Formed | Formed |
|  |  | Coating layer |  | — | — | — | — | — | — | — |
|  | Bonding layer |  |  | — | Formed | — | — | — | — | — |
|  | Display element |  |  | OLED | LCD | LCD | LCD | LCD | LCD | LCD |
|  | Antireflection layer |  | Display element | — | — | — | — | Formed | — | Formed |
|  |  |  | Light guiding plate | — | — | — | — | — | Formed | Formed |
| Proportion of obliquely emitted light [%] |  |  |  | 85 | 80 | 85 | 85 | 85 | 85 | 85 |
| Evaluation | Contrast | Front | OFF | Preferable result |  |  |  | A |  |  |
|  |  |  | Measurement result | A | A | A | A | A | A | A |
|  |  |  | ON | Preferable result |  |  |  | A |  |  |
|  |  |  | Measurement result | A | A | A | A | A | A | A |
|  |  | 45° | OFF | Preferable result |  |  |  | A |  |  |
|  |  |  | Measurement result | A | A | A | A | A | A | A |
|  |  |  | ON | Preferable result |  |  |  | D |  |  |
|  |  |  | Measurement result | D | D | D | D | D | D | D |
|  |  | 60° | OFF | Preferable result |  |  |  | A |  |  |
|  |  |  | Measurement result | — | A | A | A | A | A | A |
|  |  |  | ON | Preferable result |  |  |  | D |  |  |
|  |  |  | Measurement result | — | C | D | D | D | D | D |
| Reflected glare of reflected light under external light |  |  |  | — | A | B | B | A | A | A |

In this evaluation, regarding the front, a high contrast is preferable irrespective of turning-on or turning-off of the light source, that is, A is most preferable.

Regarding 45° and 60°, in a case where the light source is turned off, a high contrast is preferable, that is, A is most preferable. In a case where the light source is turned on, a low contrast is preferable, that is, D is most preferable.

As shown in the above table, according to the display device of the present invention, even in a state in which the light source is turned off, a high contrast display is performed in the front and in a 45° direction, and even in a 60° direction, and good visibility can be obtained at a wide viewing angle. However, in a state in which the light source is turned on, the visibility in a 45° direction and even in a 60° direction is lowered and a display at a narrow viewing angle is performed.

In Example 1 in which the apex angle of the triangular grooves is larger than the angle in a preferable range, the visibility in a 45° direction is low compared with other examples, but the visibility in a 60° direction corresponding to visual observation from the lateral direction is very low. That is, this example is suitably applicable in a case where a large viewing angle limitation is not required, and only the visibility in the lateral direction having a large angle with respect to the normal line of the light guiding plate is lowered.

In Example 8 in which the bonding layer is provided, the effect of narrowing the viewing angle is lightly low compared with other examples but reflected glare of reflected light under external light is remarkably reduced. That is, this example is suitably applicable in a case where a wide viewing angle display and a narrow viewing angle display can be switched and a high quality image display is also important.

In Examples 9 to 13 in which the antireflection layer is provided on the surface of the light guiding plate on which unevenness is formed and/or on the image display surface of the display element, the effect of narrowing the viewing angle is high and reflected glare of reflected light under external light is remarkably reduced.

In contrast, in Comparative Example 1 in which the light guiding plate is not provided, since a normal LCD is used, it is not possible to switch between a display at a wide viewing angle and a display at a narrow viewing angle.

In Comparative Example 2 in which the proportion of obliquely emitted light is 75%, light is emitted from the light guiding plate in the front direction by turning on the light source, and the visibility in the front in a case where the light source is turned on is significantly deteriorated.

Therefore, the effects of the present invention are clear.

The present invention can be preferably used as a display device for a tablet PC, a laptop PC, a smartphone, and the like.

EXPLANATION OF REFERENCES 10, 28, 36, 42, 50: display device
12: display element
14, 30, 52, 72: light guiding plate
14a, 30a, 52a, 72a: rear surface
14b, 30b, 52b, 72b: visible surface
16: light source
20: groove
30A, 52A, 72A: main body
32: convex portion
38: coating layer
46, 62: bonding layer
54: support layer
58: binder layer
60: particle
a, b, Z: light
B: 45° line
N: normal line

What is claimed is:

1. A display device comprising:
a display element; and
an optical switching element which is disposed on a visible side of the display element,
wherein the optical switching element includes a light guiding plate and a light source for causing light to be incident on an end surface of the light guiding plate, and
80% or more of light emitted from the light guiding plate in a case where the light source is turned on is emitted to a region at an angle of 30° or more with respect to a normal line of the light guiding plate on a principal surface on an opposite side of the display element,
wherein at least one principal surface of the light guiding plate has an uneven shape,
wherein the uneven shape is formed of convex portions that the principal surface of the light guiding plate has,
wherein the convex portion is formed by a particle, and
wherein the light guiding plate has a light guiding plate main body, a support layer which is laminated on the light guiding plate main body, a binder layer which is laminated on the support layer, and the particle which is held in the binder layer and protrudes from the binder layer.

2. A display device comprising:
a display element and
an optical switching element which is disposed on a visible side of the display element,
wherein the optical switching element includes a light guiding plate and a light source for causing light to be incident on an end surface of the light guiding plate,
80% or more of light emitted from the light guiding plate in a case where the light source is turned on is emitted to a region at an angle of 30° or more with respect to a normal line of the light guiding plate on a principal surface on an opposite side of the display element,
wherein at least one principal surface of the light guiding plate has an uneven shape
wherein the uneven shape is formed of convex portions that the principal surface of the light guiding plate has,
wherein the convex portion is formed by a particle, and
wherein the light guiding plate has a light guiding plate main body, a binder layer which is laminated on the light guiding plate main body, and the particle which is held in the binder layer and protrudes from the binder layer.

3. The display device according to claim 1,
wherein the principal surface of the light guiding plate having the uneven shape is covered by a layer having a different refractive index from that of the convex portion.

4. The display device according to claim 1, further comprising:
an air layer between the display element and the light guiding plate.

5. The display device according to claim 1, further comprising:
a bonding layer which is provided between the display element and the light guiding plate for bonding the display element and the light guiding plate and has a difference in refractive index from the light guiding plate of 0.05 or more.

6. The display device according to claim 1, further comprising:
an antireflection layer on the principal surface of the light guiding plate on a display element side.

7. The display device according to claim 1, further comprising:
an antireflection layer provided on an image display surface of the display element.

8. The display device according to claim 2,
wherein the principal surface of the light guiding plate having the uneven shape is covered by a layer having a different refractive index from that of the convex portion.

9. The display device according to claim 2, further comprising:
an air layer between the display element and the light guiding plate.

10. The display device according to claim 2, further comprising:

a bonding layer which is provided between the display element and the light guiding plate for bonding the display element and the light guiding plate and has a difference in refractive index from the light guiding plate of 0.05 or more.

11. The display device according to claim 2, further comprising:
an antireflection layer on the principal surface of the light guiding plate on a display element side.

12. The display device according to claim 2, further comprising:
an antireflection layer provided on an image display surface of the display element.

\* \* \* \* \*